(12) United States Patent
Yamauchi et al.

(10) Patent No.: US 6,717,460 B2
(45) Date of Patent: Apr. 6, 2004

(54) SEMICONDUCTOR DEVICE

(75) Inventors: Tadaaki Yamauchi, Hyogo (JP); Takeo Okamoto, Hyogo (JP); Junko Matsumoto, Hyogo (JP); Zengcheng Tian, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/211,289

(22) Filed: Aug. 5, 2002

(65) Prior Publication Data
US 2003/0081461 A1 May 1, 2003

(30) Foreign Application Priority Data
Oct. 29, 2001 (JP) ......................................... 2001-331396

(51) Int. Cl.[7] .............................. G05F 1/10; G05F 3/02
(52) U.S. Cl. ...................... 327/544; 327/538; 327/333; 365/226
(58) Field of Search ................................. 327/544, 530, 327/540, 541, 543, 333; 365/226, 227; 326/63, 81

(56) References Cited

U.S. PATENT DOCUMENTS 5,295,112 A * 3/1994 Taniguchi ................... 365/227
6,392,944 B1 * 5/2002 Kono .......................... 365/208

* cited by examiner

*Primary Examiner*—Terry D. Cunningham
*Assistant Examiner*—Quan Tra
(74) *Attorney, Agent, or Firm*—McDermott, Will & Emery

(57) ABSTRACT

A level conversion circuit is provided, at an output, with an initialization circuit for setting the output signal of the level conversion circuit for generating a power cut enable signal controlling a deep power down mode to a predetermined inactive state upon power up. The initialization circuit is constituted by, for example, a capacitive element connected to the output node of the level conversion circuit to pull up the voltage of the output node upon power up, and a latch circuit latching the voltage level of the output node. When power is on, the power cut enable signal is forcibly inactivated by the initialization circuit to generate a periphery power supply voltage. The internal node of the level conversion circuit is initialized according to the output signal of a control circuit receiving the periphery power supply voltage as an operating power supply voltage. In semiconductor memory device having a deep power down mode, an internal voltage is generated reliably and properly upon power up of an internal voltage.

7 Claims, 19 Drawing Sheets

SEMICONDUCTOR DEVICE

BACKGROUND OF THE INVENTION

1. Field of the Invention

The present invention generally relates to semiconductor devices, and particularly to a structure of an internal voltage generation circuit generating an internal voltage of the semiconductor device from an external power supply voltage. More particularly, the present invention relates to a control structure for a deep power down mode that prohibits an internal voltage generation operation.

2. Description of the Background Art

FIG. 21 schematically shows a structure of an array of a conventional dynamic random access memory (DRAM). In FIG. 21, a memory cell MC is arranged corresponding to a crossing of bit lines BL and ZBL and a word line WL. In FIG. 21, memory cell MC arranged corresponding to a crossing of bit line BL and word line WL is depicted as a representative thereof. Memory cells MC are arranged in rows and columns. Word line WL is arranged corresponding to each memory cell row. A pair of bit lines BL and ZBL is arranged corresponding to each memory cell column. Memory cell MC is arranged corresponding to a crossing of one bit line of the bit lines and a word line.

For bit lines BL and ZBL, there are provided a bit line equalize circuit BPE for precharging and equalizing bit lines BL and ZBL to the level of a bit line precharge voltage Vbl, and a sense amplifier SA for amplifying the difference of the voltages of bit lines BL and ZBL and latching the amplified voltage. For sense amplifier SA, there are provided a sense activation transistor ASPT rendered conductive when a sense amplifier activation signal/SAP is active, to couple a sense power supply line transmitting an array power supply voltage Vdds of a high level power supply node to sense amplifier SA, and a sense amplifier activation transistor ASNT render conductive when a sense amplifier activation signal SAN is active, to couple to a sense ground line transmitting a ground voltage Vss to a low level power supply node of sense amplifier SA.

Memory cell MC includes a memory capacitor MC storing information in the form of charges, and an access transistor MT for coupling memory cell capacitor MC with a corresponding bit line (or ZBL) according to a signal voltage on word line WL. Access transistor MT is generally formed of an N channel MOS transistor (insulated gate field effect transistor). A negative bias voltage Vbb is applied to the back gate of access transistor MT. By applying the negative bias voltage Vbb to the back gate of access transistor MT, the threshold voltage is rendered stable, the parasitic capacitance between the signal line and the substrate region is reduced, and the junction capacitance of drain/source of the access transistor is reduced.

A bit line equalize circuit BPE transmits a bit line precharge voltage Vbl of an intermediate voltage (Vdds/2) of an array power supply voltage Vdds to bit lines BL and ZBL according to a bit line equalize designating signal BLEQ.

Word line WL is driven to the level of a high voltage Vpp higher than array power supply voltage Vdds when selected. By driving a selected word line WL to the level of high voltage Vpp, data of an H level corresponding to array power supply voltage Vdds can be stored in the node of memory capacitor MC without any loss due to the threshold voltage of access transistor MT of memory cell MC.

Memory capacitor MQ receives a constant cell plate voltage Vcp at an electrode node (cell plate node) facing to the storage node that stores data. In general, this cell plate voltage Vcp corresponds to the voltage level of the intermediate voltage (Vdds/2) of array power supply voltage Vdds.

Thus, a plurality of kinds of voltages at different voltage levels are employed in a DRAM as described above. In the case where the plurality of kinds of voltages are generated externally and then applied to the DRAM, the system scale will be increased. Also, power consumption of the entire system will increase (due to wiring loss). Furthermore, the number of power supply terminals will increase in the DRAM. Therefore, the plurality of kinds of voltages are generated inside the DRAM.

FIG. 22 schematically shows a structure of the portion related to internal voltages of the DRAM. Referring to FIG. 22, the DRAM includes a memory cell array 902 having a plurality of memory cells (memory cell MC of FIG. 21) arranged in rows and columns, a control circuit 904 responsive to an externally applied command CMD for generating an operation control signal required to perform an operation mode specified by command CMD, a row select circuit 906 rendered active under control of control circuit 904 to drive to a selected state a word line arranged corresponding to an addressed row in memory cell array 902 according an externally applied row address signal RA, a sense amplifier group 908 selectively rendered active by control circuit 904 to sense, amplify and latch data of memory cells on the row selected by row select circuit 906, a column select circuit 910 operating under control of control circuit 904 to select a memory cell in an addressed column in memory cell array 902 according to an externally applied column address signal CA when active, and an internal voltage generation circuit 900 generating various internal voltages Vpp, Vbb, Vbl, Vcp, Vdds and Vddp from an external power supply voltage EXVDD.

A periphery power supply voltage Vddp from internal voltage generation circuit 900 is applied to control circuit 904 and row select circuit 906. A high voltage Vpp from internal voltage generation circuit 900 is applied to row select circuit 906. In row select circuit 906, there are provided a row decoder receiving the peripheral power supply voltage Vddp as an operation power supply voltage and a word line driver receiving a high voltage Vpp. A row select signal is generated by the row decode circuit through decoding of a received row address signal. The word line driver transmits a word line select signal of the level of high voltage Vpp to a word line arranged corresponding to a row selected by the row select signal generated by the row decode circuit.

Memory cell array 902 is supplied with bit line precharge voltage Vbl, cell plate voltage Vcp and a negative bias voltage Vbb applied to the substrate region of memory cell array 902. Array power supply voltage Vdds is applied to sense amplifier group 908 as an operating power supply voltage of the sense amplifiers. In general, periphery power supply voltage Vddp is applied to column select circuit 910 as an operating power supply voltage (column select signal may be at the level of array power supply voltage Vdds).

By operating the peripheral circuit such as control circuit 904 with periphery power supply voltage Vddp and operating sense amplifier group 908 related to memory cell array 902 with array power supply voltage Vdds, the peripheral circuit is operated at high speed to achieve high speed access, while the breakdown voltage of the access transistor and memory cell capacitor of memory cell MC is ensured to allow data to be stored stably.

FIG. 23 schematically shows a structure of internal voltage generation circuit 900 of FIG. 22. Referring to FIG. 23, internal voltage generation circuit 900 includes a constant current source 950 generating a constant current of a constant level from external power supply voltage EXVDD, reference voltage generation circuits 951, 952 and 953 converting the constant current from constant current source 950 into a voltage to generate a reference voltage Vrefd for high voltage, a reference voltage Vrefp for periphery power supply voltage and reference voltage Vrefs for array power supply voltage, respectively, a negative voltage generation circuit 954 receiving external power supply voltage EXVDD as an operating power supply voltage to generate a negative voltage Vbb, and a high voltage generation circuit 955 receiving external power supply voltage EXVDD as an operating power supply voltage to generate a high voltage Vpp.

Negative voltage generation circuit 954 includes an oscillation circuit oscillating with a current corresponding to the driving current of constant current source 950 being an operating current, and a pump circuit carrying out a charge pump operation according to the output signal from the oscillation circuit to generate the negative voltage.

High voltage generation circuit 955 includes an oscillation circuit having the operating current determined by the driving current of constant current source 950 to oscillate at a predetermined cycle, a pump circuit carrying out a charge pump operation according to the oscillation signal of the oscillation circuit to generate high voltage Vpp, and a circuit for shifting the level of the voltage output from the pump circuit for comparison with reference voltage Vrefd from reference voltage generation circuit 951 to selectively activate a pump operation according to the comparison result.

A circuit for detecting the voltage level of negative voltage Vbb is also provided in negative voltage generation circuit 954. In general, the level detection circuit utilizing the threshold voltage of a MOS transistor (insulated gate field effect transistor) is employed for the purpose of detecting the level of negative voltage Vbb.

Internal voltage generation circuit 900 further includes a periphery power supply circuit 956 generating a periphery power supply voltage Vddp from external power supply voltage EXVDD based on reference voltage Vrefp from reference voltage generation circuit 952, an array power supply circuit 957 generating an array power supply voltage Vdds from external power supply voltage EXVDD according to reference voltage Vrefs from reference voltage generation circuit 953, a cell plate voltage generation circuit 958 generating a cell plate voltage Vcp of an intermediate voltage level from array power supply voltage Vdds, and a precharge voltage generation circuit 959 receiving array power supply voltage Vdds as an operating power supply voltage to generate a bit line precharge voltage Vbl of an intermediate voltage level.

Periphery power supply circuit 956 includes an active power supply circuit 950a operating in an active cycle where an internal operation is carried out in the semiconductor memory device, to generate periphery power supply voltage Vddp from external power supply voltage EXVDD at a large current drivability to suppress drop of periphery power supply voltage Vddp during an internal circuit operation, and a standby power supply circuit 950b constantly operating in a standby state and an active cycle to generate periphery power supply voltage Vddp from external power supply voltage EXVDD with a small consuming current. Standby power supply circuit 950b functions to prevent drop of the level of periphery power supply voltage Vddp caused by leakage current and the like during a standby cycle.

Similarly, array power supply circuit 957 includes an active power supply circuit 957a rendered active in an active cycle to generate array power supply voltage Vdds from external power supply voltage EXVDD at a large current drivability, and a standby power supply circuit 957b operating in a standby cycle and active cycle to suppress, with a small consuming current, drop of array power supply voltage Vdds caused by a leakage current.

Cell plate voltage generation circuit 958 and precharge voltage generation circuit 959 generate an intermediate voltage at a level of half the array power supply voltage Vdds as cell plate voltage Vcp and bit line precharge voltage Vbl, respectively.

FIG. 24 shows an example of a structure of periphery power supply circuit 956 of FIG. 23. Referring to FIG. 24, active power supply circuit 956a includes a comparison circuit 961 comparing, when active, a reference voltage Vrefp and periphery power supply voltage Vddp on a periphery power supply line 969, a current drive transistor 962 supplying a current to periphery power supply line 969 from an external power supply node according to an output signal of comparison circuit 961, a power supply activation transistor 963 forming an operating current path of comparison circuit 961 according to an active cycle designating signal ACT, and a P channel MOS transistor 964 coupling the external power supply node with the output node of comparison circuit 961 when active cycle designating signal ACT is inactive.

Standby power supply circuit 956b includes a comparison circuit 965 comparing periphery power supply voltage Vddp on periphery power supply line 969 with reference voltage Vrefp, and a current drive transistor 966 supplying current from the external power supply node to periphery power supply line 969 according to an output signal from comparison circuit 965.

In active power supply circuit 956a, current drive transistor 962 is formed of a P channel MOS transistor, whereas power supply activation transistor 963 is formed of an N channel MOS transistor. When active cycle designating signal ACT is at an L level, power supply activation transistor 963 is OFF (non-conductive) and MOS transistor 964 is ON (conductive). Under this state, the gate of current drive transistor 962 is at the level of external power supply voltage EXVDD, whereby current drive transistor 962 maintains an OFF state. Comparison circuit 961 is inhibited of a comparison operation since the operating current path is cut off.

When active cycle designating signal ACT attains an H level, power supply activation transistor 963 is turned on, whereby a path of flowing the operating current of comparison circuit 961 is formed. MOS transistor 964 is turned off, whereby the external power supply node is disconnected from the output node of comparison circuit 961. Under this state, current drive transistor 962 supplies a current corresponding to the difference between reference voltage Vrefp and periphery power supply voltage Vddp from the external power supply node to periphery power supply line 969. For example, when periphery power supply voltage Vddp is lower than reference voltage Vrefp, the output signal of comparison circuit 960 attains a low level according to the voltage difference. Responsively, current drive transistor 962 supplies a current from the external power supply node to periphery power supply line 960 in accordance with the output signal of comparison circuit 961. When periphery power supply voltage Vddp becomes higher than reference voltage Vrefp, the output signal of comparison circuit 961 attains an H level, to turn off power supply drive transistor 962.

Standby power supply circuit 956b carries out an operation similar to that of active power supply circuit 950a when active cycle designating signal ACT is at an active state of an H level. Standby power supply circuit 956b simply functions to prevent drop of periphery power supply voltage Vddp of periphery power supply line 969 caused by a leakage current during standby. The operating current of comparison circuit 965 and the driving current of power supply drive transistor 966 are set low.

As for internal power supply circuit 956a, a large amount of current is consumed during the operation of internal circuit using periphery power supply voltage Vddp. To compensate for this large consumed current, comparison circuit 961 and current drive transistor 962 have a large current drivability to maintain periphery power supply voltage Vddp at a predetermined voltage level. In a stable state, periphery power supply voltage Vddp attains a level identical to that of reference voltage Vrefp in the structure shown in FIG. 25.

Array power supply circuit 957 has a structure similar to that of periphery power supply circuit 956 shown in FIG. 24. In array power supply circuit 957, array reference voltage Vrefs is used instead of peripheral reference voltage Vrefp. The generated power supply voltage is array power supply voltage Vdds, not periphery power supply voltage Vddp.

In accordance with the increase of the system scale, a semiconductor device is strongly requested to reduce power consumption, in order to prevent generation of heat in the system. Particularly, in the application of portable equipment using a battery as a power source, the consumed current or current dissipation must be reduced from the standpoint of the battery's lifetime. In a practical use, the duration of a standby state where data access is not effected is longer than the period of time where data processing is actually carried out. In a DRAM, only retention of data is required in a standby state. Therefore, there is a strong demand for reducing the consumed current in a standby state.

As one method of reducing the consumed current in a standby state, a power down mode is employed conventionally. In this power down mode, the supply of an operating power supply voltage to circuitry that does not relate to data retention such as an address input buffer circuit is stopped. Accordingly, the direct current path for the circuitry not related to data retention is cut off to reduce the leakage current of the circuitry. Accordingly, the consumed current is reduced.

Recently, there is a strong demand to further reduce the standby current. Reflecting the requirement of such an ultra low standby current, a mode called "deep power down mode" is employed. In this deep power down mode, the internal voltage generation operation of the internal voltage generation circuit is stopped. It is to be noted that a power down mode is set by an externally applied command, and therefore, power supply voltage is still applied to the circuit related to exiting from the power down mode, such as the command decoder that receives a command.

FIG. 25 schematically shows a structure of the portion for performing a control of the deep power down mode. Control circuit 904 in FIG. 25 generates a power cut signal PCUT at a level of periphery power supply voltage Vddp when an externally applied command CMD specifies a deep power down mode. In the deep power down mode, the operation of constant current source 950 and reference voltage generation circuit 952 are to be inhibited. In order to control the circuit that receives the external power supply voltages as an operating power supply voltage, power cut signal PCUT from control circuit 904 is converted by a level conversion circuit 960 into a power cut enable signal PCUTe having an amplitude of the level of external power supply voltage EXVDD. Reference voltage generation circuit 952 and constant current source 950 are inhibited of a constant current generation operation and reference voltage generation operation when this power cut enable signal PCUTe is rendered active. This power cut enable signal PCUTe is also applied to the peripheral circuit to cut off the current path of each peripheral circuit.

In the deep power down mode, current will not be consumed by circuitry other than the required circuitry. Leakage current will not be generated since the current path of the peripheral circuit is cut off. Therefore, the consumed current can be reduced significantly.

FIG. 26 shows an example of a structure of level conversion circuit 960 of FIG. 25. Referring to FIG. 26, level conversion circuit 960 includes an inverter IV1 receiving power cut signal PCUT output from control circuit 904, an N channel MOS transistor NQ1 connected between a node ND0 and a ground node and receiving an output signal of inverter IV1 at its gate, an N channel MOS transistor NQ2 connected between a node ND1 and the ground node and receiving a power cut signal PCUT from control circuit 904 at its gate, a P channel MOS transistor PQ1 connected between an external power supply node and node ND0 and having its gate connected to node ND1, a P channel MOS transistor PQ2 connected between the external power supply node and internal node ND1 and having its gate connected to node ND0, and an inverter IV2 inverting the signal of node ND1 to generate a power cut enable signal PCUTe. Inverter IV1 receives periphery power supply voltage Vddp as an operating power supply voltage. Inverter IV2 receives external power supply voltage EXVDD as the operating power supply voltage.

When power cut signal PCUT is at an L level, in the level conversion circuit shown in FIG. 26, the output signal of inverter IV1 attains H level, MOS transistor NQ1 receiving the output of inverter IV1 is ON, and MOS transistor NQ2 is OFF. Therefore, node ND0 is discharged by MOS transistor NQ1 and is reduced in voltage level. The conductance of MOS transistor PQ2 increases, whereby the voltage level at node ND1 goes high. In response, the conductance of MOS transistor PQ1 is reduced, and node ND0 attains the level of the ground voltage. Node ND1 is charged by MOS transistor PQ2 and attains the level of external power supply voltage EXVDD. Under this state, power cut enable signal PCUTe output from inverter IV2 receiving the signal of node ND1 attains an L level.

Conversely, when power cut signal PCUT is at an H level, inverter IV1 provides an output signal of an L level. MOS transistor NQ1 is OFF whereas MOS transistor NQ2 is ON. In such a state, node ND1 attains the level of the ground voltage whereas node ND0 attains the level of external power supply voltage EXVDD. Power cut enable signal PCUTe attains the level of external power supply voltage EXVDD. In other words, level conversion circuit 960 converts the amplitude of power cut signal PCUT received from control circuit 904 while maintaining the logic level thereof.

Periphery power supply voltage Vddp is generated according to external power supply voltage EXVDD. When external power supply voltage EXVDD is powered up, periphery power supply voltage Vddp is stabilized later than external power supply voltage EXVDD. When node ND1 is maintained at an H level in level conversion circuit 960 in such a state, power cut enable signal PCUTe is at an L level. Therefore, constant current source 950 and reference voltage generation circuit 950 reliably operate to raise periphery power supply voltage Vddp up to a predetermined voltage level.

When external power supply voltage EXVDD is powered up, periphery power supply voltage Vddp is at the level of the ground voltage. Power cut signal PCUT is also at the L level. Furthermore, the output signal of inverter IV1 shown in FIG. 26 is at an L level, and MOS transistors NQ1 and NQ2 are both OFF. When external power supply voltage EXVDD rises in level under such a state, the voltage levels of internal nodes ND0 and ND1 are in an uncertain state. Therefore, it may be possible that the voltage level of node ND1 would rise to an intermediate voltage level. When the voltage level of node ND1 rises to such intermediate voltage level, power cut enable signal PCUTe output from inverter IV2 attains an intermediate voltage level. Accordingly, constant current source 950 and reference voltage generation circuit 952 will be incompletely inhibited of the constant current generation operation and reference voltage generation operation. Thus, reference voltage Vrefp cannot be raised up to a predetermined voltage level and accordingly, peripheral power supply voltage Vddp cannot be raised to a predetermined voltage level.

When power cut enable signal PCUTe of an intermediate voltage level is set to an H level according to the stabilization of external power supply voltage EXVDD as shown in FIG. 28 when power is turned on, the operation of constant current source 950 and reference voltage generation circuit 952 is completely stopped, so that peripheral power supply voltage Vddp will not be generated. Since power cut signal PCUT from control circuit 904 maintains an L level state in such a situation, power cut enable signal PCUTe will maintain the initial state set upon power-on according to the unstable state of level conversion circuit 960 at the time of power-on. Therefore, the event of suppressing generation of periphery power supply voltage Vddp of a predetermined voltage level will be continued.

If such an event is caused in a practical use, the non-generation of periphery power supply voltage in a deadlock state of power cut enable signal PCUTe cannot be detected. As a result, erroneous operation of the entire system will occur.

In a deep power down mode, the entry and exit are set according to an externally applied command. In order to accept this command, an operating power supply voltage must be supplied, even during a deep power down mode, at least to circuitry related to the command specifying this deep power down mode.

FIG. 29 shows an example of a structure of reference voltage generation circuit 952 to supply an operating power supply voltage to circuitry related to a deep power down command specifying a deep down mode. Referring to FIG. 29, periphery power supply circuit 952 includes a basic voltage generation circuit 970 generating a basic voltage Vrefp0 from external power supply voltage EXVDD, and an analog buffer buffering basic voltage Vrefp0 to generate reference voltage Vrefp. Basic voltage generation circuit 970 has its current drivability set small enough to reduce the consumed current. By buffering (amplifying) this basic voltage Vrefp0 using an analog buffer, basic voltage Vrefp0 can be stabilized at high speed. Also, this reference voltage Vrefp can be supplied to the periphery power supply circuit stably.

This analog buffer includes a P channel MOS transistor ND2 connected between the external power supply node and a node ND2, and having its gate connected to node ND2, a P channel MOS transistor PQ4 connected between the external power supply node and a node ND3, and having its gate connected to node ND2, an N channel MOS transistor NQ3 connected between nodes ND2 and ND4, and receiving basic voltage Vrefp0 at its gate, an N channel MOS transistor NQ4 connected between nodes ND3 and ND4, and having its gate connected to node ND3, a constant current source 971 connected between node ND4 and the ground node, and an N channel MOS transistor NQ5 connected between node ND4 and the ground node, and receiving a reference voltage stabilization detection signal PORs at its gate.

In this analog buffer, MOS transistors PQ3 and PQ4 form a current mirror stage. MOS transistors NQ3 and NQ4 form a differential stage. When basic voltage Vrefp0 is higher than reference voltage Vrefp, the voltage level of node ND3 rises to raise the voltage level of reference voltage Vrefp. When basic voltage Vrefp0 is lower than reference voltage Vrefp, the voltage level of node N3 is reduced, whereby the voltage level of reference voltage Vrefp is lowered. Therefore, reference voltage Vrefp is set to a voltage level identical to that of basic voltage Vrefp0.

Reference voltage stabilization detection signal PORs is rendered active when reference voltage Vrefs for the array power supply attains a predetermined voltage level or stabilizes at the predetermined voltage level when external power supply voltage EXVDD is powered up. The operating current of the analog buffer is increased to drive reference voltage Vrefp to a stable state at high speed in accordance with the reference voltage stabilization detection signal PORs upon power up of the external power supply voltage.

It is to be noted that the control circuit to receive a command to exit from the deep power down mode must be rendered active by periphery power supply circuit 952 even in a deep power down mode. When the control circuit is rendered active, reference voltage Vrefp must be generated even in this deep power down mode. This means that reference voltage stabilization detection signal PORs must be maintained at an inactive state of an L level upon exit from the deep power down mode. This is for preventing unnecessary current from being consumed since reference voltage generating circuit 952 is always operative to generate reference voltage Vrefp in a deep power down mode.

Reference voltage stabilization detection signal PORs is also applied to reference voltage generation circuits 951 and 953 shown in FIG. 24. This is done for increasing the operating current of the analog buffer in the reference voltage generation circuits at the time of power-on.

FIG. 30 schematically shows a structure of an analog buffer of a reference voltage generation circuit generating a reference voltage other than the reference voltage for the periphery power supply. The analog buffer of the reference voltage generation circuit shown in FIG. 30 has a structure similar to that of the analog buffer shown in FIG. 29, except for a P channel MOS transistor PQ4 being arranged between the external power supply node and node ND5 to cut off the current. Therefore, the components in the analog buffer of FIG. 30 corresponding to those of the analog buffer of FIG. 29 have the same reference characters allotted, and detailed description thereof will not be repeated.

Power cut enable signal PCUTe is applied to the gate of P channel MOS transistor PQ4 for cutting off current. In the reference voltage generation circuit shown in FIG. 30, power cut enable signal PCUTe attains the level of external power supply voltage EXVDD in a deep power down mode. MOS transistor PQ4 is turned off, and reference voltage Vref is pulled down to the level of the ground voltage. Reference voltage stabilization detection signal PORs must be set to an H level in order to drive reference voltage Vref to a stable state at high speed upon exit from the deep power down mode.

The reference voltage stabilization detection signal PORs is commonly applied to the reference voltage generation circuit shown in FIG. 29 and the reference voltage generation circuit shown in FIG. 30. Therefore, when reference voltage stabilization detection signal PORs is set to an L level in the reference voltage generation circuit of FIG. 29 that operates even in a deep power down mode, reference voltage stabilization detection signal PORs to the reference voltage generation circuit shown in FIG. 30 also attains an L level upon exit from the deep power down mode. Therefore, the current drivability of the analog buffer of this reference voltage generation circuit accommodates only the operating current applied by constant current source 971 of a steady state upon exit from the deep power down mode. Therefore, reference voltage Vref cannot be stabilized at high speed. An internal power supply voltage such as the array power supply voltage is generated based on such a reference voltage Vref. Furthermore, an intermediate voltage is produced according to this array power supply voltage. Thus, there is a problem that the internal voltage cannot be driven to a predetermined voltage level at high speed.

FIG. 31 schematically shows a structure of a reference voltage stabilization detection signal generation unit. In FIG. 31, reference voltage stabilization detection signal PORs is generated by a voltage stabilization detection circuit 975 that detects stabilization of reference voltage Vrefs for the array power supply voltage. In this case, reference voltage stabilization detection signal PORs for the reference voltage generation circuit shown in FIG. 31 has to be maintained at an inactive state upon exit from the deep power down mode. Therefore, deep power down mode exit designating signal DPDW is applied to voltage stabilization detection circuit 975. Since reference voltage stabilization detection signal PORs from voltage stabilization detection circuit 975 is applied in common to all the reference voltage generation circuits, the reference voltage generation circuit shown in FIG. 30 cannot render MOS transistor NQ5 that is to function as a current source active upon exit from the deep power down mode.

In the case where deep power down mode exit designating signal DPDW is to be generated to stop the detection operation of voltage stabilization detection circuit 975 upon exit from the deep power down mode, a signal that is kept at an active state for a predetermined time in response to a fall of power cut enable signal PCUTe must be generated as deep power down mode exit designating signal DPDW. Current is consumed in the circuit that generates this deep power down mode exit designating signal DPDW, resulting in increased consumed current.

Another possible configuration may be considered as follows. Voltage stabilization detection circuit 975 is allowed to continue the operation of detecting the voltage level of reference voltage Vrefs. A logical product signal of reference voltage stabilization detection signal PORs and deep power down mode exit designating signal DPDW will be applied as a current control signal to the reference voltage generation circuit shown in FIG. 29. However, even in such configuration, a circuit for generating deep power down mode exit designating signal DPDW must be provided. Therefore, the consumed current will increase.

Furthermore, when such a deep power down mode exit designating signal DPDW is employed, a problem arises similar to that for the above-described power cut enable signal PCUTe. When deep power down mode exit designating signal DPDW is rendered active erroneously at the time of power on, the reference voltage cannot be set to a stable state at high speed. As a result, stabilization of the internal voltage will be delayed.

SUMMARY OF THE INVENTION

An object of the present invention is to provide an internal voltage generation circuit that can stabilize at high speed an internal voltage related to an internal power supply voltage upon recovery of the internal power supply voltage.

Another object of the present invention is to provide an internal voltage generation circuit that can generate an internal voltage reliably at high speed when power supply voltage is powered up.

A further object of the present invention is to provide an internal voltage generation circuit that can generate an internal power supply voltage properly when power is turned up.

Still another object of the present invention is to provide an internal voltage generation circuit that can generate an internal power supply voltage at high speed upon exit from a deep power down mode.

A still further object of the present invention is to provide an internal voltage generation circuit that can generate a reference voltage used for generating an internal voltage stably at high speed in exit from a deep power down mode without increasing the consumed current in the deep power down mode.

According to an aspect of the present invention, a semiconductor device includes a control circuit receiving a first power supply voltage as an operating power supply voltage and generating a first power control signal according to an operation mode designation, a level conversion circuit for level-converting the first power control signal into a second power control signal having an amplitude of a level of a second power supply voltage, an initialization circuit for setting the output signal of the level conversion circuit to a predetermined voltage level when the second power supply voltage is powered up, and a power supply circuit selectively rendered active according to the second power control signal to generate a first power supply voltage from the second power supply voltage.

According to a second aspect of the present invention, a semiconductor device includes an internal voltage generation circuit receiving a first power supply voltage and generating a second power supply voltage from the first power supply voltage, an internal circuit receiving the second power supply voltage as an operating power supply voltage and generating an internal operation control signal according to an externally applied operation mode designation, and a level conversion circuit converting an amplitude of a predetermined control signal from the internal circuit into the amplitude of the first power supply voltage level to generate a specific operation control signal, a logic circuit receiving the first power supply voltage as an operating power supply voltage and performing a logic operation of the specific operation control signal to generate a buffer control signal, and a switch circuit coupling a power supply line transmitting the second power supply voltage to a power supply node supplying the first power supply voltage according to the buffer control signal output from the logic circuit.

According to a third aspect of the present invention, a semiconductor device includes a first internal power supply circuit generating a second power supply voltage from a first power supply voltage, a first internal circuit receiving the second power supply voltage as an operating power supply voltage and generating an operation control signal according to an applied operation mode designating signal, a level conversion circuit receiving the first power supply voltage as an operating power supply voltage and converting a specific operation control signal from the first internal circuit into a signal of the amplitude of the first power supply voltage level, and an internal voltage generation circuit selectively rendered active according to the output signal from the level conversion circuit to generate an internal voltage different from the second power supply voltage from the first power supply voltage. The first internal power supply circuit operates independent of the output signal of the level conversion circuit.

According to a fourth aspect of the present invention, a semiconductor device includes an internal control circuit receiving the voltage on an internal power supply line as an operating power supply voltage and generating an internal operation control signal according to an operation mode designating signal, a level conversion circuit converting a specific operation control signal from the internal control circuit into a signal of the amplitude of the first power supply voltage level, a mode control circuit generating a valid operation control signal according to the output signal of the level conversion circuit and a mode designating signal specifying one of first and second modes, and an internal power supply circuit selectively rendered active in response to the valid operation control signal from the mode control signal to generate a second power supply voltage from the first power supply voltage on an internal power supply line in the first node, and a voltage corresponding to the first power supply voltage on the inner power supply line in the second mode.

According to a fifth aspect of the present invention, a semiconductor device includes a first basic voltage generation circuit selectively rendered active in response to an operation mode designating signal to generate a first basic voltage from a first power supply voltage, a first reference voltage generation circuit receiving the first power supply voltage as an operating power supply voltage to generate a first reference voltage of a level corresponding to the first basic voltage, a second basic voltage generation circuit selectively rendered active in response to an operation mode designating signal to generate a second basic voltage from the first power supply voltage, a second reference voltage generation circuit receiving the first power supply voltage as an operating power supply voltage and generating, according to the second basic voltage, a second reference voltage of a voltage level corresponding to the second basic voltage, a reference voltage level detection circuit for detecting arrival of the first reference voltage to a predetermined voltage level based on the voltage relationship between the first basic voltage and the first reference voltage, a power supply control circuit generating a power control signal according to the output signal from the reference voltage level detection circuit and an operating mode designating signal, a first auxiliary circuit arranged at the first reference voltage generation circuit and increasing the current drivability of the first reference voltage generation circuit in response to a power control signal, a second auxiliary circuit arranged at the second reference voltage generation circuit and increasing the current drivability of the second reference voltage generation circuit in response to a power control signal, and a voltage fixation circuit for fixing the voltage of the output node of the first reference voltage generation circuit at a predetermined voltage level in response to an operation mode designating signal.

By providing an initialization circuit for setting the output signal of a level conversion circuit that generates a second power control signal at a predetermined voltage level when the second power supply voltage is powered up, the voltage of the output signal of the level conversion circuit can be reliably prevented from entering an uncertain state when the second power supply voltage is powered up. Thus, the second power control signal can be set at a predetermined voltage level reliably. Accordingly, the second power control signal can be prevented from entering an unstable voltage level when power is up. A predetermined first power supply voltage can be generated from the power supply circuit.

By coupling the power supply line of the internal circuit generating an operating control signal to a first power supply voltage supply node according to a specific buffer control signal, the operating power supply voltage of the internal circuit can be set to the first power supply voltage when power is turned on. Accordingly, the internal circuit can be operated to set a specific operation control signal to a predetermined logic level.

The first internal circuit generating a specific buffer control signal and a first internal power supply circuit that is always operative utilize the second power supply voltage as the operating power supply voltage, the operation control signal is already set at a predetermined state when this power supply voltage is powered up. Therefore, the internal operation can be properly set to a predetermined state.

When the voltage level of the internal power supply line differs for a different mode, a valid operation control signal is generated according to the signal specifying the mode and a specific operation control signal, and the operation of the internal power supply circuit is controlled according to the generated valid operation control signal. Therefore, an internal reference voltage of a predetermined voltage level can be generated properly according to the operation control signal when power is turned on.

The output node of the reference voltage generation circuit is fixed at a predetermined voltage level during a specific operation mode period in response to an operation mode designating signal. By detecting that the reference voltage of the output node of the reference voltage generation circuit arrives at a predetermined voltage level when exiting from the specific operation mode, a power control signal is generated according to the detected result and an operation mode designation. Thus, the current drivability of the reference voltage generation circuit can be adjusted according to the generated power control signal. Upon exit from a deep power down mode, a powered-down reference voltage can be driven to a predetermined voltage level at high speed with the current drivability increased. The reference voltage can be generated stably and at high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
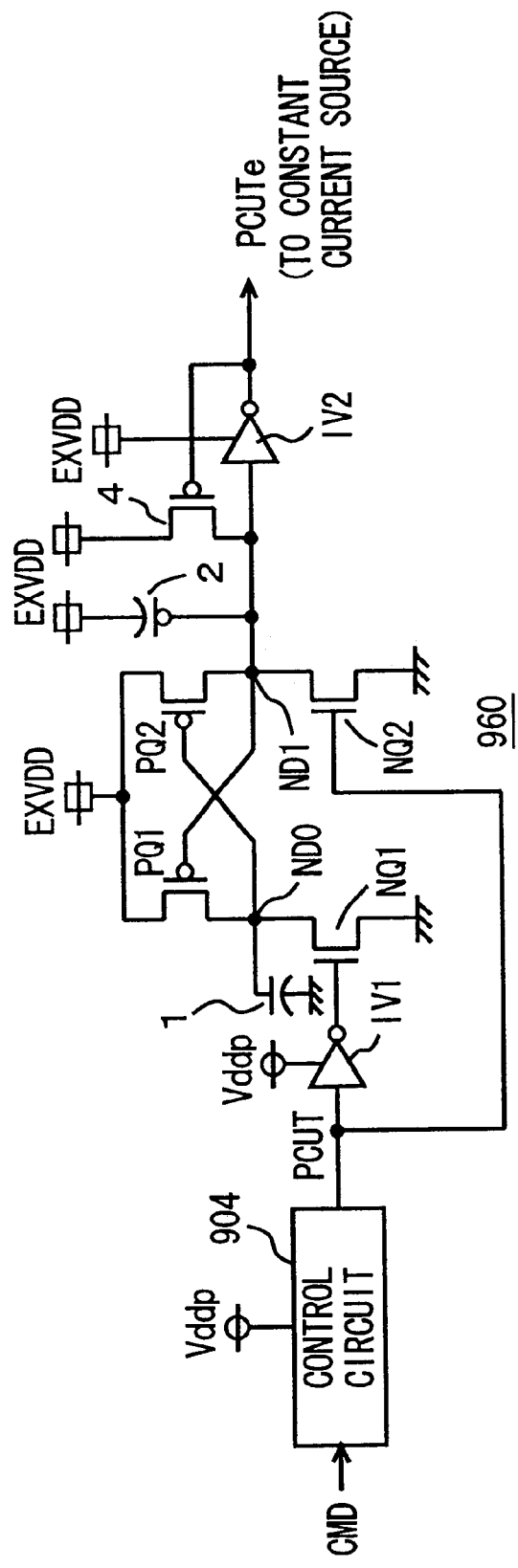
FIG. 1 shows a structure of a power cut enable signal generation unit according to a first embodiment of the present invention.

FIG. 1 schematically shows a structure of a main part of an internal voltage generation circuit according to a first embodiment of the present invention. In FIG. 1, the structure of the circuit for generating a power cut enable signal PCUTe is schematically shown. Referring to FIG. 1, in a level conversion circuit 960 provided to convert the amplitude of a power cut signal PCUT from a control circuit 904, a capacitive element 1 is connected to a node ND0, and a capacitive element 2 is connected to a node ND1.

Capacitive element 1 is connected between node ND0 and the ground node, whereas capacitive element 2 is connected between an external power supply node and node ND1. These capacitive elements 1 and 2 are formed of MOS capacitors. Specifically, capacitive element 1 is formed of an N channel MOS transistor, and capacitive element 2 is formed of a P channel MOS transistor.

At the output of level conversion circuit 960, a P channel MOS transistor 4 is provided, which selectively charges node ND1 to the level of an external power supply voltage EXVDD according to an output signal of an inverter IV2. A power cut enable signal PCUTe is output from inverter IV2 to be applied to constant current source 950 and others shown in FIG. 25. The remaining structure of level conversion circuit 960 shown in FIG. 1 is similar to that of level conversion circuit 960 shown in FIG. 26. Therefore, corresponding components have the same reference characters allotted, and detailed description thereof will not be repeated.

Figure 2:
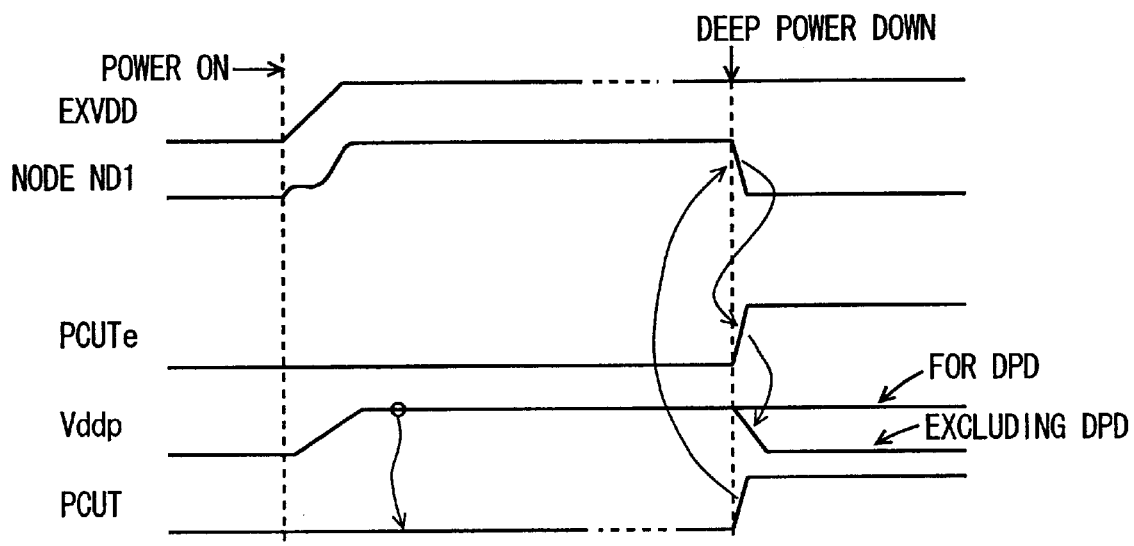
FIG. 2 is a signal waveform diagram representing an operation of the circuitry shown in FIG. 1.

FIG. 2 is a signal waveform diagram representing the operation of the power cut enable signal generation unit shown in FIG. 1. The operation of the circuitry shown in FIG. 1 will now be described with reference to FIG. 2.

Upon power up of external power supply voltage EXVDD, the voltage level of external power supply voltage EXVDD at the external power supply node rises. In response to this rise of the voltage level of external power supply voltage EXVDD, the voltage level at node ND1 rises through the capacitive coupling of capacitive element 2. At the time of power on, periphery power supply voltage Vddp is not yet generated. In response to external power supply voltage EXVDD, an internal power supply circuit 956 for a periphery power supply voltage (periphery power supply circuit) generates periphery power supply voltage Vddp. When external power supply voltage EXVDD is powered up, power cut signal PCUT from control circuit 904 and the output signal from inverter IV1 are both at an L level, and MOS transistors NQ1 and NQ2 are both OFF or in a non-conductive state.

Since nodes ND0 and ND1 are electrically floating, the voltage level at node ND1 rises according to the rise of the level of power supply voltage EXVDD through capacitive coupling by capacitive element 2. When the voltage level at node ND1 exceeds the input logic threshold voltage of inverter 3, the output signal of inverter 3 attains an L level. Responsively, MOS transistor 4 is turned on to drive node ND1 to the level of external power supply voltage EXVDD. The voltage level at the node ND 1 is latched by inverter 3 and MOS transistor 4. By means of capacitive element 1 connected between node ND0 and the ground node, node ND0 is maintained at the level of the ground voltage when power is turned on. This means that MOS transistor PQ2 is maintained at an ON state or in a conductive state when this power is turned on. Therefore, the voltage level at node ND1 can be reliably increased when an external power supply voltage is powered up.

In this latched state, node ND1 is maintained at the level of the external power supply voltage. Therefore, power cut enable signal PCUTe output from inverter IV2 is fixed at an L level. Even if node ND1 rises to an intermediate voltage level when power is turned on, node ND1 is reliably maintained at the level of external power supply voltage EXVDD by means of inverter IV2 and MOS transistor 4. Therefore, power cut enable signal PCUTe is reliably maintained at an L level.

Figure 25:
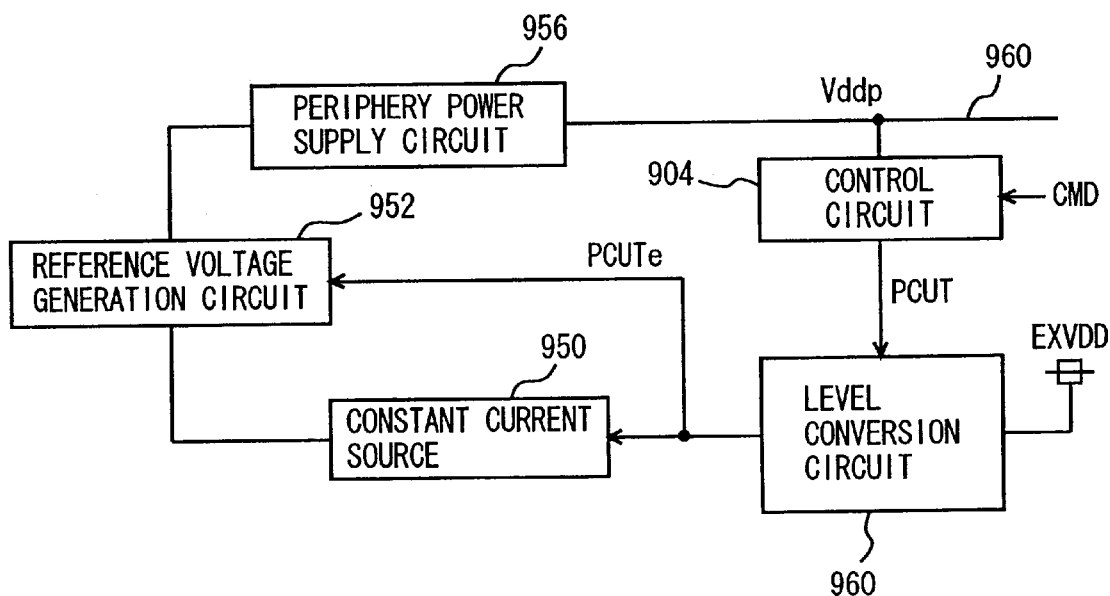
FIG. 25 schematically shows a structure of a conventional power supply control unit.
Figure 26:
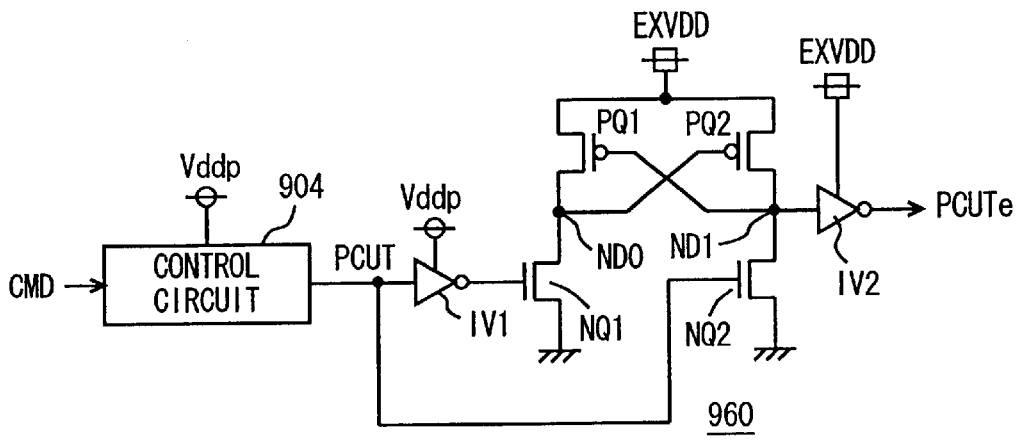
FIG. 26 shows an example of a structure of the level conversion circuit of FIG. 25.
Figure 27:
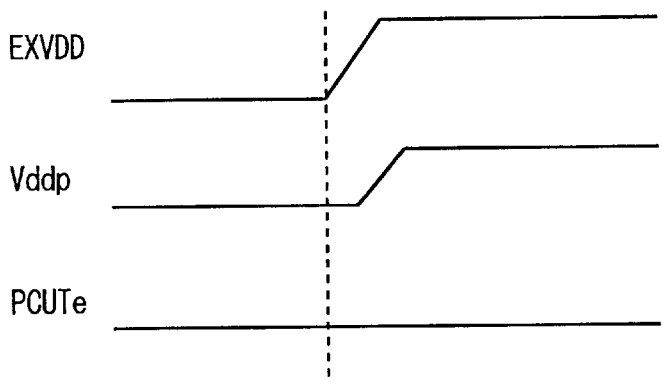
FIGS. 27 and 28 are signal waveform diagrams representing an operation of the level conversion circuit of FIG. 26.
Figure 28:
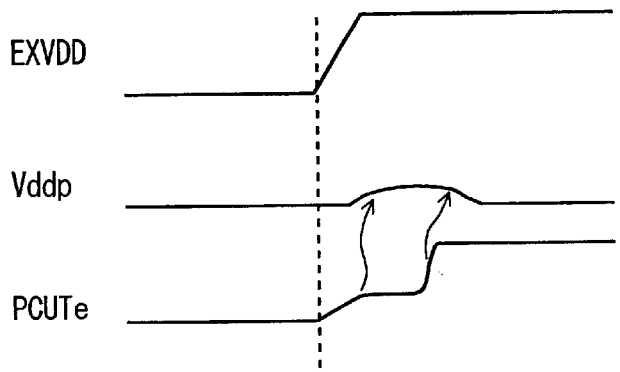
Figure 29:
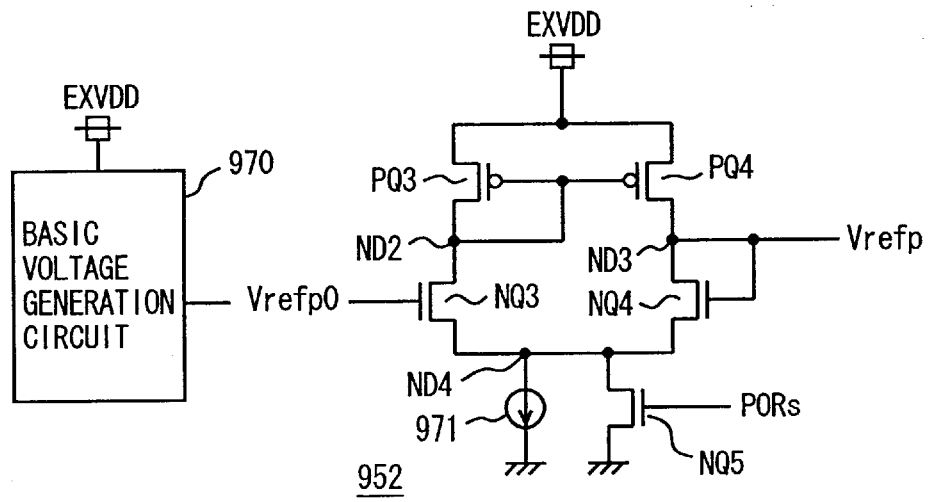
FIG. 29 shows a structure of a reference voltage generation circuit for the periphery power supply voltage of FIG. 23.
Figure 30:
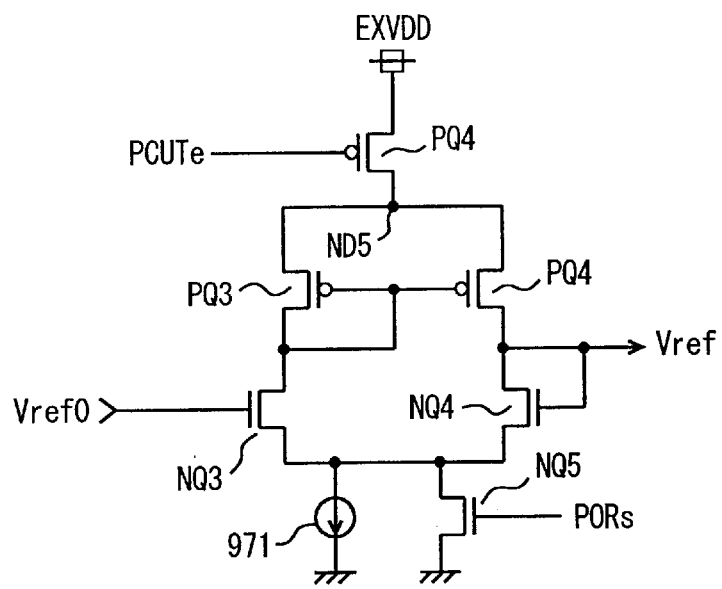
FIG. 30 shows a structure of another reference voltage generation circuit of FIG. 23.
Figure 31:
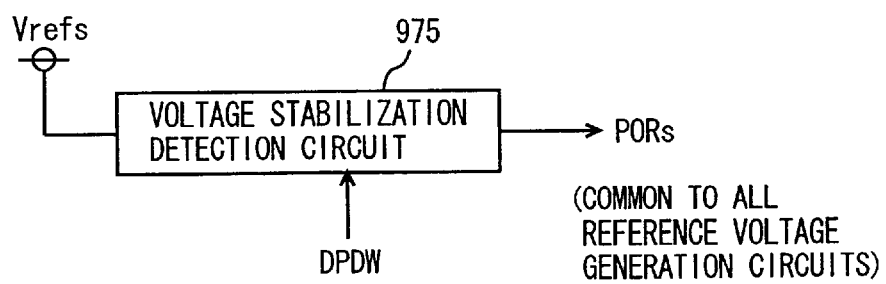
FIG. 31 schematically shows a structure of the portion related to generating a power supply voltage power on detection signal of FIGS. 29 and 30.

Since power cut enable signal PCUTe is set at an L level upon power up, constant current source 950 shown in FIG. 25 operates to supply a constant current. Periphery power supply voltage Vddp is driven to and stabilized at a predetermined voltage level by reference voltage generation circuit 952 and periphery power supply circuit 956.

Upon stabilization of periphery power supply voltage Vddp, power cut signal PCUT from control circuit 904 is set at an L level, and the output signal of inverter IV1 attains an H level. In response to the rise of the output signal of inverter IV1 to an H level, MOS transistors NQ1 and NQ2 are turned ON and OFF, respectively, in level conversion circuit 960. In response, node ND0 is discharged to the level of the ground voltage. MOS transistor PQ2 responsively turns conductive, whereby node ND1 is charged to the level of external power supply voltage EXVDD. In this state, power cut enable signal PCUTe output from inverter IV2 is maintained at an L level, and MOS transistor 4 maintains a conductive state.

According to the present embodiment, capacitive coupling is caused at capacitive element 2 upon power up of external power supply voltage EXVDD. Also, MOS transistor PQ2 is maintained conductive by capacitive element 1. Therefore, the voltage level at node ND1 rises upon power up, so that the signal output from inverter IV2 reliably attains an L level. Thus, power cut enable signal PCUTe is maintained at an L level after power up of external power supply voltage EXVDD.

In the case where a deep power down mode is set in a normal operation mode, a deep power down mode command DPD is applied to control circuit 904 as a command CMD, whereby power cut signal PCUT from control circuit 904 is set to an H level.

When power cut signal PCUT is set at an H level, inverter IV1 provides an output signal of an L level. The latching capability of the latch circuit constituted by inverter IV2 and MOS transistor 4 is made low enough. Therefore, node ND1 is discharged by MOS transistor NQ2 according to power cut signal PCUT to attain the level of the ground voltage. Also, node ND0 is charged by MOS transistor PQ1 to attain the level of external power supply voltage EXVDD. In response, power cut enable signal PCUTe output from inverter IV2 attains an H level, whereby the reference current generation operation of constant current source 950 is ceased. Accordingly, the generation operation of each reference voltage is inhibited to stop generation of an internal voltage.

In a deep power down mode, MOS transistor 4 is made non-conductive according to output signal PCUTe of inverter IV2, whereby the charging operation towards node ND1 is stopped. Therefore, power cut enable signal PCUTe is maintained at an H level even if supply of a periphery power supply voltage to control circuit 904 is ceased since external power supply voltage EXVDD is supplied in a deep power down mode.

When the operation of the reference voltage generation circuit is made inactive, reference voltages other than the reference voltage related to the periphery power supply voltage is inhibited from being generated. The reference voltage for the periphery power supply voltage differs depending upon the structure of the peripheral circuitry. In the case where control circuit 904 receives a periphery power supply voltage in common to other circuitry in the peripheral circuitry, the reference voltage for periphery power supply voltage must be generated even in a deep power down mode, as will be described later. This is because a command for releasing the deep power down mode must be accepted, and the command must be constantly monitored during a deep power down mode.

In the case where control circuit 904 receives a periphery power supply voltage separately from that for the other circuits, generation of a periphery power supply voltage to the peripheral circuitry excluding the control circuit is inhibited. If the periphery reference voltage generation circuit is arranged for the peripheral circuit excluding the control circuit 904 in such arrangement, the periphery reference voltage generation circuit is inhibited of the reference voltage generation operation in a deep power down mode. In contrast, the reference voltage generation circuit for the control circuit 904 generates a reference voltage.

As for the periphery power supply voltage Vddp, a circuit operating according to command DPD specifying a deep power down mode must be supplied with periphery power supply voltage Vddp constantly. With regards to peripheral circuitry that is not related to the control operation of setting a deep power down mode, supply of periphery power supply voltage Vddp is ceased according to power cut enable signal PCUTe.

The latch circuit constituted by inverter 3 and MOS transistor 4 has its latching capability set low enough. When MOS transistor NQ2 is conductive, node ND1 is discharged to the level of the ground voltage, and MOS transistor 4 maintains an off state or a non-conductive state.

By providing a latch circuit and capacitive element that drive the voltage level of internal node ND1 of level conversion circuit 960 to the level of external power supply voltage when external power supply voltage EXVDD is powered up, as shown in FIG. 1, the voltage level of internal node ND1 of level conversion circuit 960 is prevented from turning uncertain state when power is turned on. Thus, the voltage level of node ND1 can be reliably set to the level of external power supply voltage EXVDD upon power up. Therefore, power cut enable signal PCUTe can be reliably set to an active state of an L level when power is turned on.

Node ND0 is inhibited from rising in voltage level by capacitive element 1, and MOS transistor PQ2 is reliably set in an on state. When node ND1 is set at the level of external power supply voltage EXVDD, the source/drain of MOS transistor PQ2 attain the same voltage level to be turned off, even if the gate voltage is indefinite. Node ND1 is maintained at the level of external power supply voltage EXVDD, and the gate voltage and the source voltage of MOS transistor PQ1 become equal, so that MOS transistor PQ1 is OFF. Therefore, if the voltage level of node ND2 can be increased high enough when power is turned on by means of the latch circuit constituted by inverter IV2 and MOS transistor 4, and capacitive element 2, capacitive element 1 is dispensable.

By maintaining output node ND1 of level conversion circuit 960 at the level of external power supply voltage EXVDD when power is turned on, the rise of internal nodes ND0 and ND1 in level conversion circuit 960 to an intermediate voltage level can be prevented. Thus, a power cut enable signal PCUTe of an unstable state will not be generated.

Particularly, by connecting a capacitive element between the external power supply node and node ND1 at the output of level conversion circuit 960, the voltage level of node ND1 can be caused to rise according to the rise of external power supply voltage EXVDD through the capacitive coupling. This prevents the voltage level of node ND1 from attaining an uncertain state. Power cut enable signal PCUTe can reliably be set at an inactive state of an L level when power is turned on. A power supply voltage generation operation can be reliably carried out at the periphery power supply circuit and the other, to ensure the generation of an internal voltage.

In the case where the output signal of inverter IV1 is applied to the gate of MOS transistor NQ2 in the structure shown in FIG. 1, such a structure may be employed, in which cascaded inverters of two stages are connected to output node ND1 of level conversion circuit 960, and the level of node ND1 is driven to the ground voltage according to the output signal from the inverter of the last stage in the cascade. An external power supply voltage is applied as the operating power supply voltages of these inverters of two stages. Power cut enable signal PCUTe is output from the inverter of the last stage.

In this structure, when the voltage level of node ND1 rises, the last stage inverter of the two stages provides an output signal of an H level, whereby the discharging MOS transistor for initialization is turned on, and node ND1 is held at the level of the ground voltage. In other words, a latch circuit holding node ND1 at the level of the ground voltage is formed of the inverters of two stages and one MOS transistor.

When the voltage level of node ND1 is at a low level, the output signal of the last stage inverter attains an L level, whereby the MOS transistor is turned off. Therefore, to ensure that the voltage of node ND1 is held at the level of the ground voltage, the input logic threshold value of the first stage inverter is set low enough. An advantage similar to that of the structure shown in FIG. 1 can be obtained by the above-described structure.

According to the first embodiment of the present invention, a capacitive element and a latch circuit are provided at the output node of a level conversion circuit that generates a power cut enable signal of an external power supply voltage level. Thus, the internal node of that level conversion circuit can be prevented from turning unstable, so that a power cut enable signal of a desired voltage level can be reliably generated. Thus, inhibition of an internal power supply voltage generation operation can be prevented when power is turned on.

Furthermore, by arranging a logic gate that receives a power on detection signal and the output signal of a latch circuit at the next stage of the latch circuit, the power cut enable signal can be held at an inactive state when power is turned on without adversely affecting the mode specification in a normal operation mode.

Second Embodiment

Figure 3:
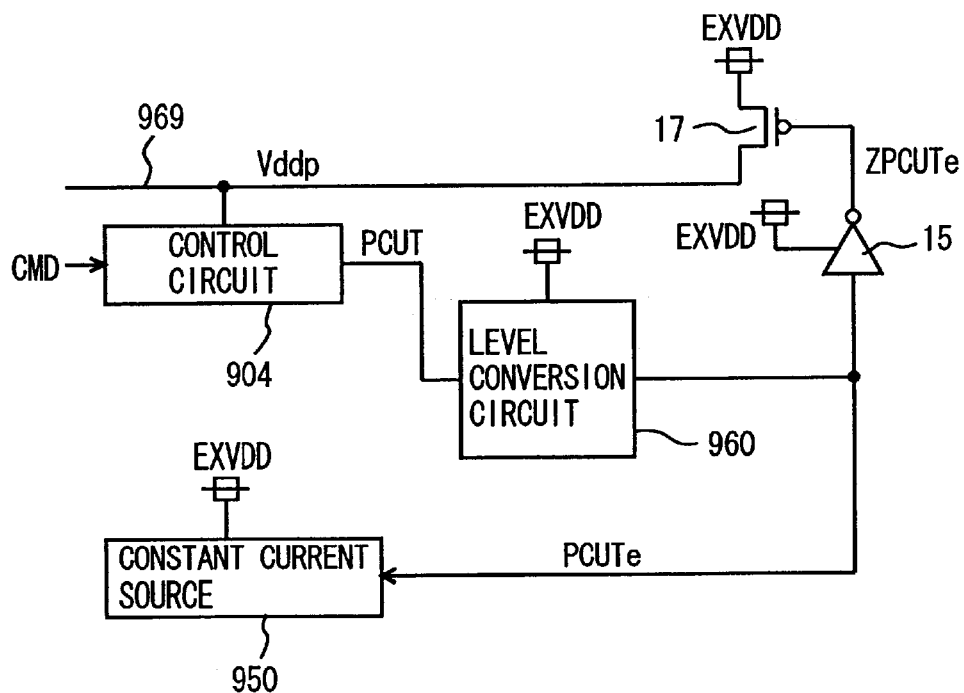
FIG. 3 schematically shows a structure of a main part of an internal voltage generation circuit according to a second embodiment of the present invention.

FIG. 3 schematically shows a structure of an internal voltage generation section according to a second embodiment of the present invention. Referring to FIG. 3, the internal voltage generation circuit includes an inverter circuit 15 receiving an output signal of level conversion circuit 960, and a P channel MOS transistor 17 rendered conductive when an output signal ZPCUTe of inverter circuit 15 is at an L level, to charge periphery power supply line 969 to the level of external power supply voltage EXVDD.

Level conversion circuit 960 has a structure similar to that of the level conversion circuit shown in FIG. 1. Power cut signal PCUT from control circuit 904 is converted in amplitude with its logic level maintained, to generate a power cut enable signal PCUTe of an H level corresponding to the level of external power supply voltage EXVDD. Power cut enable signal PCUTe from level conversion circuit 960 is applied to constant current source 950 and others. In this level conversion circuit 960, a latch circuit and capacitive coupling need not to be provided.

Figure 4:
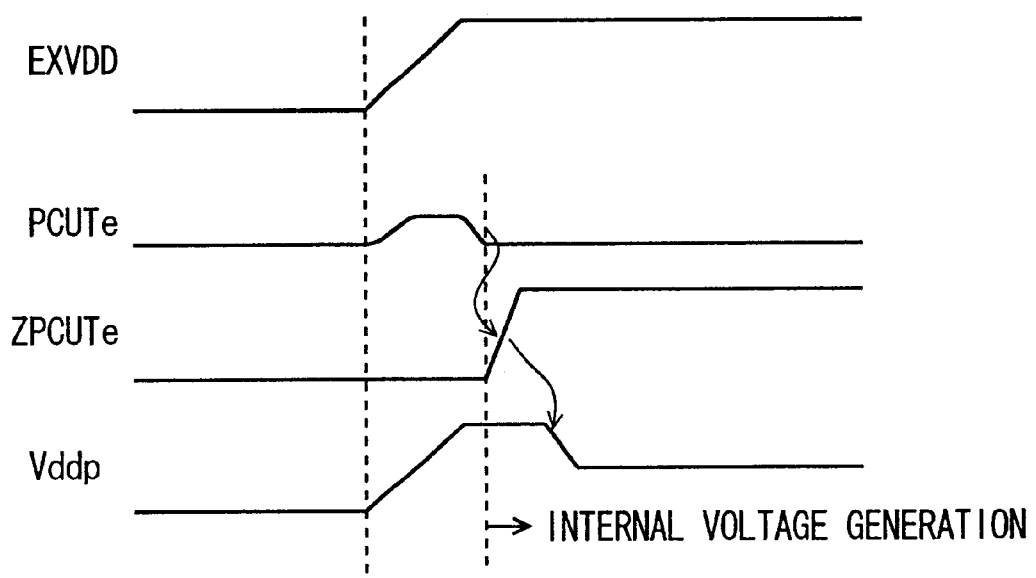
FIG. 4 is a signal waveform diagram representing an operation of the circuitry shown in FIG. 3.

FIG. 4 is a timing chart representing the operation of the internal voltage generation section of FIG. 3. The operation of the internal voltage generation circuit of FIG. 3 will now be described with reference to FIG. 4.

When node ND1 shown in FIG. 1 is held at the ground voltage level or a voltage level near the ground voltage in level conversion circuit 960 when external power supply voltage EXVDD is powered up, power cut enable signal PCUTe output from level conversion circuit 960 attains an H level. The signal ZPCUTe output from inverter 15 is set at an L level, and MOS transistor 17 is turned on. In response, peripheral power supply line 969 is electrically connected to the external power supply node, and peripheral power supply voltage Vddp attains the level of external power supply voltage EXVDD.

Therefore, control circuit 904 operates using external power supply voltage EXVDD as the operating power supply voltage, and power cut signal PCUT is set at the initial state of an L level. In response, MOS transistor NQ1 and MOS transistor NQ2 shown in FIG. 1 are turned on and off, respectively, in level conversion circuit 960 of the second embodiment. Node ND1 is charged to the level of external power supply voltage EXVDD, and power cut enable signal PCUTe is set at an L level.

When power cut enable signal PCUTe is set at an L level, constant current source 950 generates a constant current stably, whereby the reference voltage generation circuit and internal power supply circuit receiving the constant current carry out an internal voltage generation operation.

When power cut enable signal PCUTe is set at an L level during generation of this internal voltage, output signal ZPCUTe from inverter 15 attains an H level, and MOS transistor 17 maintains an off state. Therefore, periphery power supply voltage Vddp is isolated from the external power supply node and set to a predetermined voltage level by a periphery power supply circuit.

When a deep power down mode is set, power cut signal PCUT output from level conversion circuit 960 attains an H level. The output signal ZPCUTe from inverter 15 attains an L level, and MOS transistor 17 is turned on. In this case, control circuit 904 accepts a command CMD and is required to operate even in this deep power down mode, resulting in no problem.

In the second embodiment of the present invention, upon power up of external power supply voltage EXVDD, if the internal node of the level conversion circuit becomes indefinite and rises in voltage level to cause to power cut enable signal PCUTe to rise in voltage level to be initialized to the level near to the level where the deep power down mode is set, peripheral power supply voltage line 960 is coupled to the external power supply node. As a result, control circuit 904 operates using the external power supply voltage as the operating power supply voltage to initialize the power cut signal PCUT to an L level. Accordingly, level conversion circuit 960 can be properly initialized, and power cut enable signal PCUTe can be maintained at the ground voltage level of an inactive state.

Thus, the deadlock of the internal power supply voltage generation operation caused by a rise in the voltage level of power cut enable signal PCUTe when power is turned on can be inhibited. An internal voltage can be reliably generated stably after power is turned on.

Third Embodiment

Figure 5:
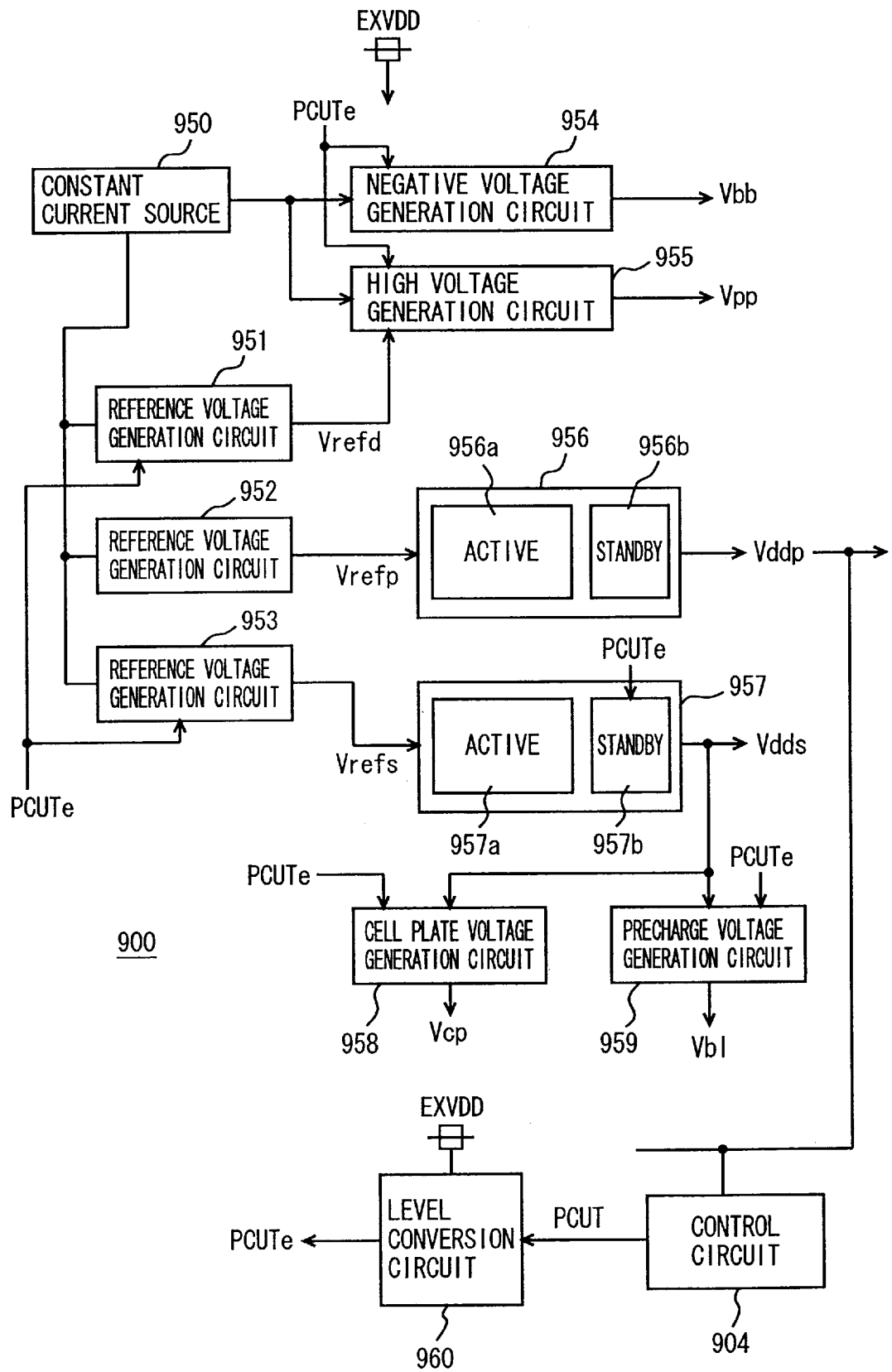
FIG. 5 schematically shows the structure of an internal voltage generation circuit according to a third embodiment of the present invention.

FIG. 5 schematically shows a structure of an internal voltage generation circuit according to a third embodiment of the present invention. In FIG. 5, power cut enable signal PCUTe is not applied to the circuitry that sets periphery power supply voltage Vddp. Specifically, power cut enable signal PCUTe is applied to a reference voltage generation circuit 951 that generates a reference voltage Vrefd for high voltage, and to a reference voltage generation circuit 953 generating a reference voltage Vrefs for an array power supply voltage. Reference voltage generation circuit 952 generates a reference voltage Vrefp according to a constant current from constant current source 950 even in a deep power down mode. In periphery power supply circuit 956, standby power supply circuit 956b operates in this deep power down mode. Periphery power supply voltage Vddp is generated according to reference voltage Vrefp and the voltage on the periphery power supply line, and is supplied to control circuit 904.

In array power supply circuit 957, power cut enable signal PCUTe is applied to standby power supply circuit 957b. Active power supply circuits 956a and 957a both maintain an inactive state since the activation signal (ACT) is inactive in a deep power down mode.

Power cut enable signal PCUTe is applied to a negative voltage generation circuit 954, a high voltage generation circuit 955, a cell plate voltage generation circuit 958, and a precharge voltage generation circuit 959 as well.

In the third embodiment of the present invention, reference voltage generation circuit 952 and standby power supply circuit 956b related to periphery power supply voltage Vddp operate even in a deep power down mode, to generate periphery power supply voltage Vddp. The remaining voltage generation units have their voltage generation operation prohibited in a deep power down mode.

Control circuit 904 receives periphery power supply voltage Vddp as an operating power supply voltage to operate and generate power cut signal PCUT according to an externally applied command. Level conversion circuit 960 converts the level of power cut signal PCUT from control circuit 904 to generate a power cut enable signal PCUTe. Power cut signal PCUT and power cut enable signal PCUTe have the same logic level.

Now, the case is considered in which the voltage level of the internal node of level conversion circuit 960 becomes indefinite when external power supply voltage EXVDD is powered up and a power cut enable signal PCUTe of an unstable voltage level is generated. Even in such a state, constant current source 950 and reference voltage generation circuit 952 operate independently of power cut enable signal PCUTe when external power supply voltage EXVDD is powered up, to generate the reference voltage Vrefp. Periphery power supply circuit 956 operates using external power supply voltage EXVDD as an operating power supply voltage, to generate the periphery power supply voltage Vddp according to reference voltage Vrefp.

When periphery power supply voltage Vddp is generated in response to power up of external power supply voltage EXVDD, power cut signal PCUT output from control circuit 904 is initialized to an L level, and an inverted signal thereof attains an H level. In response, the voltage level of the internal node in level conversion circuit 960 (nodes ND0 and ND1 in FIG. 1) is initialized, whereby power cut enable signal PCUTe is set at an L level.

Accordingly, the circuitry generating an internal voltages operates in the remaining voltage generation portion, so that an internal voltage can be generated properly. Thus, the deadlock of an internal voltage generation operation caused by an unstable state of level conversion circuit 960 when power is turned on can be prevented.

[Modification]

Figure 6:
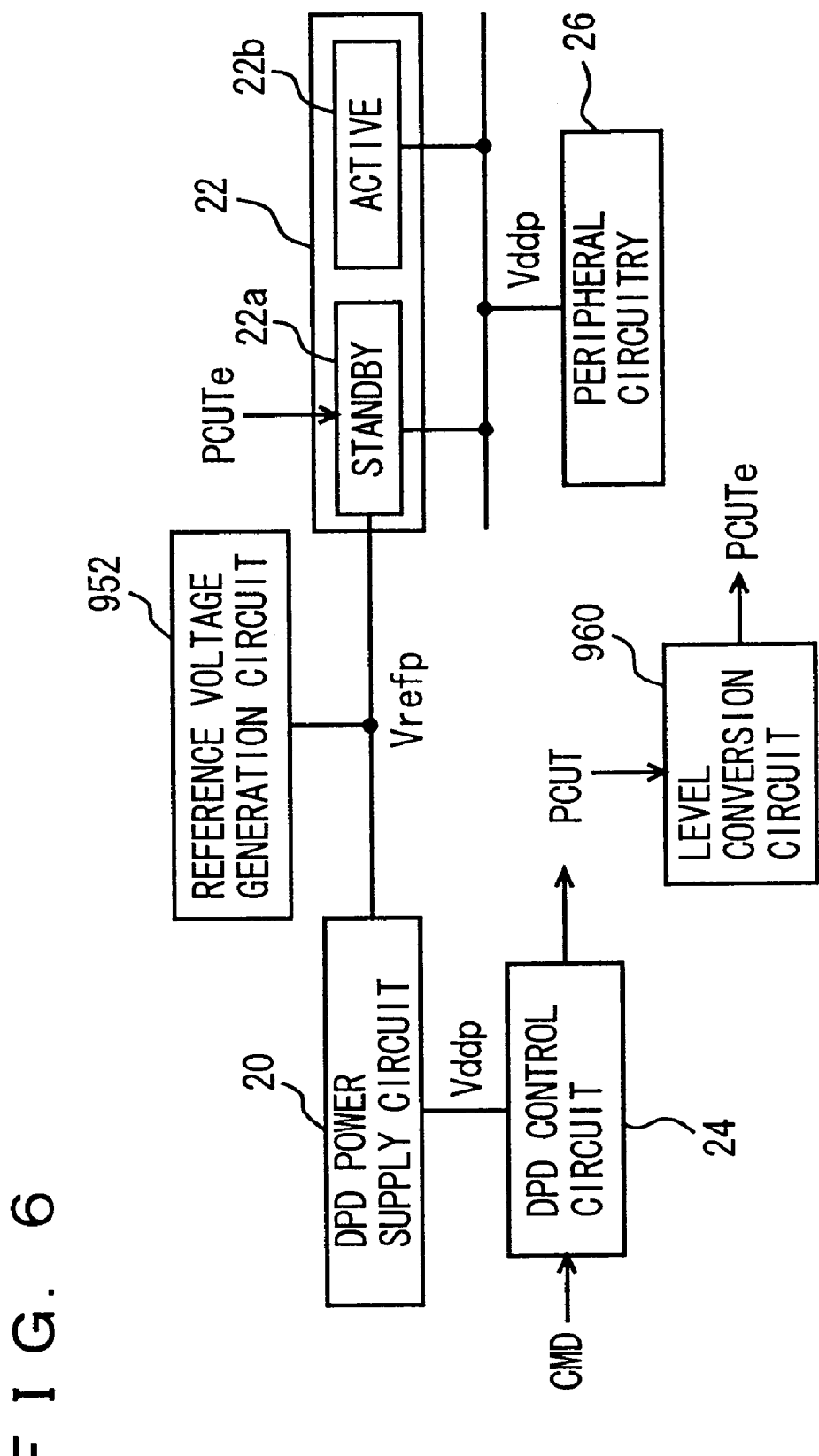
FIG. 6 schematically shows a structure of a modification of the third embodiment.

FIG. 6 schematically shows a structure of a modification of the third embodiment of the present invention. Referring to FIG. 6, the circuit that uses periphery power supply voltage Vddp as an operating power supply voltage is divided into a DPD control circuit 24 for setting a deep power down mode, and a peripheral circuit 26 such as an address decoder and a memory cell select circuit. DPD control circuit 24 includes, for example, a circuit for decoding command CMD, and a flip-flop set when the output signal of the command decode circuit indicates entry to a deep power down mode, and reset when exit of the deep power down mode is specified.

A DPD power supply circuit 20 is provided for DPD control circuit 24. A periphery power supply circuit 22 is arranged for peripheral circuit 26. Periphery power supply circuit 22 includes a standby power supply circuit 22a compensating for a leakage current in a standby state, and an active power supply circuit 22b for generating the periphery power supply voltage Vddp with a great current drivability in an active cycle. Power cut enable signal PCUTe is applied to standby power supply circuit 22a.

A reference voltage Vrefp from reference voltage generation circuit 952 is applied to DPD power supply circuit 20 and periphery power supply circuit 22. This reference voltage generation circuit 952 and DPD power supply circuit 20 operate constantly, independent of power cut enable signal PCUTe.

According to the structure shown in FIG. 6, only the required minimum circuitry related to a deep power down mode is constantly operated. Peripheral circuit 26 related to data access has supply of a power supply voltage prohibited in a deep power down mode. In the structure shown in FIG. 6, DPD control circuit 24 initializes power cut signal PCUT to an L level when external power supply voltage EXVDD is powered up and periphery power supply voltage Vddp output from DPD power supply circuit 20 is stabilized, and an inverted signal thereof is initialized to an L level. Therefore, the level conversion circuit receiving power cut signal PCUT has its internal node initialized, and power cut enable signal PCUTe is set to an L level. Accordingly, standby power supply circuit 22a of the periphery power supply circuit can generate periphery power supply voltage Vddp.

Similarly, in the circuitry that generates other internal voltages such as an array power supply voltage and a negative voltage, power cut enable signal PCUTe is set to an L level when periphery power supply voltage Vddp output from DPD power supply circuit 20 is stabilized. Therefore, a predetermined internal voltage can be reliably generated.

According to the third embodiment of the present invention, the circuit related to a deep power down mode is constantly supplied with the power supply voltage to operate. Even at the time of power up of external power supply voltage EXVDD, the power cut signal can be initialized to an L level to responsively set power cut enable signal PCUTe to an L level. Accordingly, an internal voltage can be reliably generated. A deadlock state in which generation of an internal voltage is prohibited can be prevented, and an internal voltage can be generated stably.

Fourth Embodiment

Figure 7:
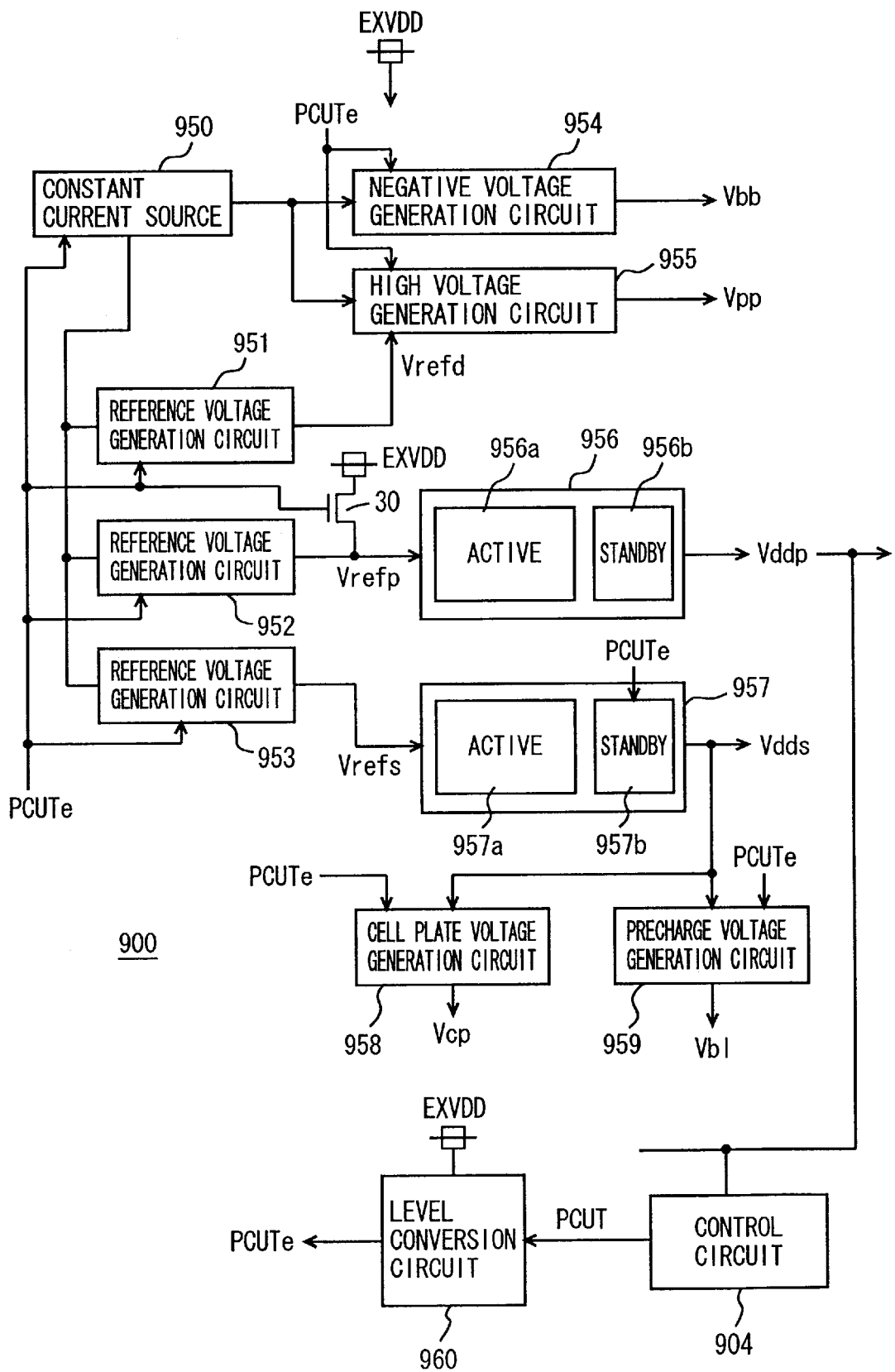
FIG. 7 schematically shows a structure of an internal voltage generation circuit according to a fourth embodiment of the present invention.

FIG. 7 schematically shows a structure of an internal voltage generation circuit according to a fourth embodiment of the present invention. The internal voltage generation circuit shown in FIG. 7 differs in construction from the internal voltage generation circuit shown in FIG. 5 in the following points. Specifically, power cut enable signal PCUTe is also applied to constant current source 950 and reference voltage generation circuit 952 that generates a reference voltage Vrefp for the peripheral circuitry. An N channel MOS transistor 30 receiving power cut enable signal PCUe at its gate is connected between the output node of reference voltage generation circuit 952 and the external power supply node. N channel MOS transistor 30 is a MOS transistor of a low threshold voltage Vthn.

When the internal state of level conversion circuit 960 becomes unstable and power cut enable signal PCUTe attains a high level when power is on, MOS transistor 30 is turned on. Particularly, in the case where power cut enable signal PCUTe is set at the level of external power supply voltage EXVDD, MOS transistor 30 is strongly turned on, whereby reference voltage Vrefp is clamped at the voltage level of EXVDD−Vthn. Therefore, according to the voltage supplied by MOS transistor 30, the standby power supply circuit in periphery power supply circuit 956 operates to generate a periphery power supply voltage Vddp. In response to generation of periphery power supply voltage Vddp, power cut signal PCUT from control circuit 904 and an inverted signal thereof attain an L level and an H level, respectively. Responsively, level conversion circuit 960 is initialized, and power cut enable signal PCUTe output therefrom is reliably set at an L level.

By making the threshold voltage Vthn of MOS transistor 30 small enough, with the voltage level of reference voltage Vrefp reliably set to a voltage level according to the level of power cut enable signal PCUTe, periphery power supply voltage Vddp can be reliably generated. Even if the voltage level of power cut enable signal PCUTe is lower than the level of external power supply voltage EXVDD in such a case, when periphery power supply voltage Vddp is set at a voltage level higher than the threshold voltage of the MOS transistor of a component of the control circuit and others, control circuit 904 can operate to set power cut signal PCUT at an L level. When the signal output from the inverter for generating complementary signals (inverter IV1 in FIG. 1) to level conversion circuit 960 attains at least the level of the threshold voltage of the MOS transistor for discharging the internal node of level conversion circuit 960 (MOS transistor NQ1 shown in FIG. 1), MOS transistor NQ1 of FIG. 1 is turned on, whereby internal node ND0 of level conversion circuit 960 shown in FIG. 1 can be set to the level of the ground voltage. Also, node ND1 can be set to the level of external power supply voltage EXVDD. Thus, the power cut enable signal PCUTe can be reliably held at the level of ground voltage.

When power cut enable signal PCUTe is set at an L level, MOS transistor 30 is turned off, whereby the reference voltage Vrefp of a predetermined voltage level is generated by reference voltage generation circuit 952.

[Modification]

Figure 8:
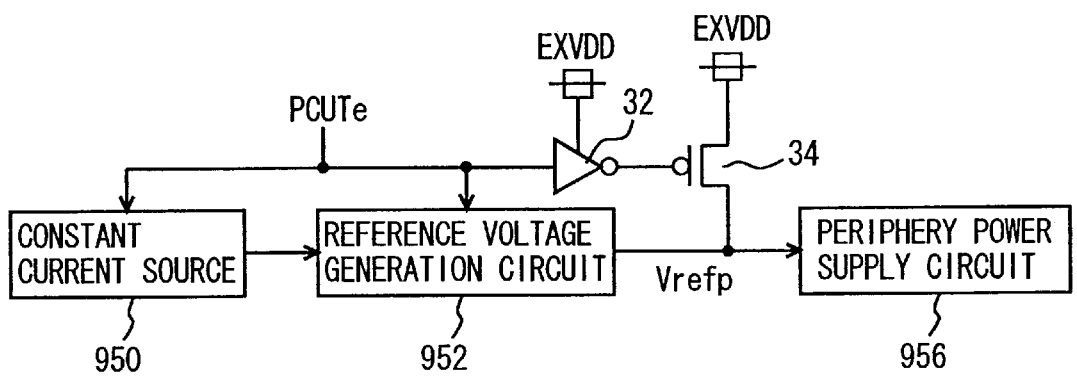
FIG. 8 schematically shows a modification of the fourth embodiment.

FIG. 8 shows a structure of a modification of the fourth embodiment of the present invention. In FIG. 8, an inverter 32 receiving a power cut enable signal PCUTe and a P channel MOS transistor 34 coupling the output node of reference voltage generation circuit 952 to the external power supply node according to the output signal of inverter 32 are provided instead of N channel MOS transistor 30 of FIG. 7. Inverter 32 receives external power supply voltage EXVDD as the operating power supply voltage. The remaining structure of the internal voltage generation circuit of FIG. 8 is similar to that of the internal voltage generation circuit shown in FIG. 7.

Constant current source 950 and reference voltage generation circuit 952 have their operation inhibited in a deep power down mode in response to power cut enable signal PCUTe. Periphery power supply circuit 956 generates a periphery power supply voltage according to voltage Vrefp at the output node of reference voltage generation circuit 952.

When the voltage level of power cut enable signal PCUTe rises in response to an unstable state of the internal node of level conversion circuit 960 when external power supply voltage EXVDD is applied, MOS transistor 34 can be turned on by inverter 32 to set reference voltage Vrefp at the level of external power supply voltage EXVDD. By forming this inverter 32 by a ratio circuit and setting the input logic threshold value thereof to a sufficiently low voltage level, reference voltage Vrefp can be set to the level of external power supply voltage EXVDD even if power cut enable signal PCUTe is at an intermediate voltage level. Therefore, periphery power supply voltage Vddp can be generated.

When power cut enable signal PCUTe is at a low level, inverter 32 provides an output signal of the level of external power supply voltage EXVDD, whereby MOS transistor 34 is reliably turned off. Therefore, reference voltage Vrefp can be reliably generated by constant current source 950 and reference voltage generation circuit 952 in such a state.

According to the fourth embodiment of the present invention, the operation of the constant current source and the reference voltage generation circuits is prohibited in a deep power down mode. The output node of the reference voltage generation circuit that generates the periphery power supply voltage is driven to a voltage level corresponding to the external power supply voltage EXVDD according to power cut enable signal PCUTe. Thus, even if the voltage level of power cut enable signal PCUTe attains a high level when power is turned on, periphery power supply circuit 956 generates periphery power supply voltage Vddp to suppress the unstable state of the level conversion circuit. Thus, a deadlock of an internal voltage generation operation caused by an unstable or indefinite state of the internal node of the level conversion circuit at the time of power on can be prevented, and an internal voltage can be generated stably.

Fifth Embodiment

Figure 9:
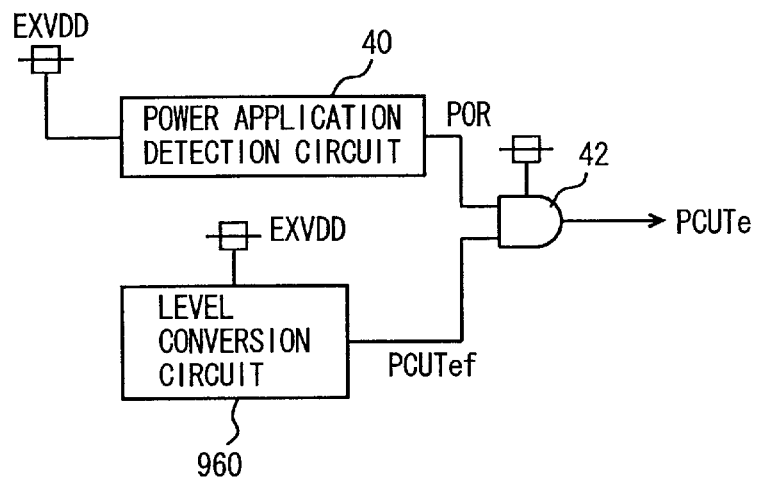
FIG. 9 schematically shows a structure of a power cut enable signal generation section according to a fifth embodiment of the present invention.

FIG. 9 schematically shows a structure of a main part of an internal voltage generation circuit according to a fifth embodiment of the present invention. Referring to FIG. 9, the internal voltage generation circuit includes a power on detection circuit 40 detecting power-on of external power supply voltage EXVDD, and an AND circuit 42 receiving an output signal POR from power on detection circuit 40 and an output signal PCUTef of level conversion circuit 960. Power cut enable signal PCUTe is generated from AND circuit 42. AND circuit 42 receives external power supply voltage EXVDD as an operating power supply voltage.

Figure 10:
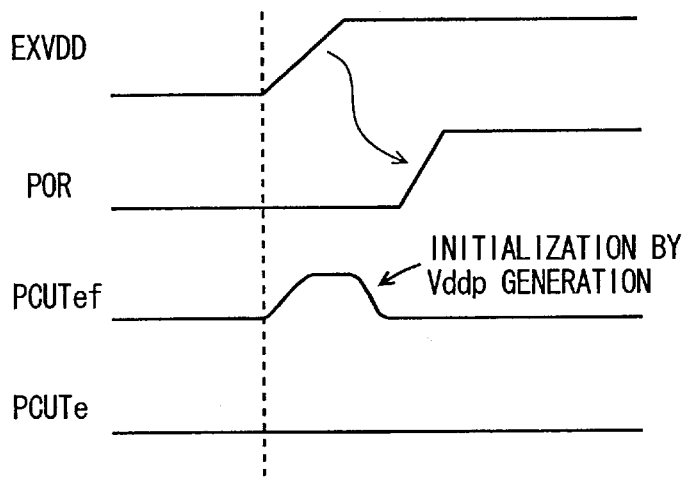
FIG. 10 is a signal waveform diagram representing an operation of the circuitry shown in FIG. 9.

FIG. 10 is a signal waveform diagram representing the operation of the circuit shown in FIG. 9. The operation of the circuitry of FIG. 9 will now be described briefly with reference to FIG. 10.

Now, the case is considered in which external power supply voltage EXVDD is powered up, and the internal state of level conversion circuit 960 becomes unstable to cause output signal PCUTef to rise to an intermediate voltage level. In this state, an output signal POR from power on detection circuit 40 maintains an L level, and power cut enable signal PCUTe outputted from AND circuit 42 maintains an L level. Therefore, each internal voltage is generated according to a constant current from constant current source 950. In response to generation of periphery power supply voltage Vddp, power cut signal PCUT from control circuit 904 is set at an L level, and the voltage level of an inverted signal of the power cut enable signal also rises.

When the voltage level of the inverted signal of power cut signal PCUT rises, and the MOS transistor driving the internal node (node ND0 in FIG. 1) of level conversion circuit 960 (MOS transistor NQ1 of FIG. 1) is turned on, output signal PCUTef of level conversion circuit 960 attains an L level. Even if output signal POR from power on detection circuit 40 attains an H level in such a state, the output signal PCUTef of level conversion circuit 960 is at an L level, and power cut enable signal PCUTe from AND circuit 40 maintains an L level. Therefore, upon power on, even if level conversion circuit 960 becomes unstable so that the output signal PCUTe rises in voltage level, an internal voltage can be reliably generated to prevent deadlock of an internal voltage generation operation.

The period of time, for which output signal POR from power on detection circuit 40 is kept at an H level, has only to be appropriately determined according to the time period required for initialization of level conversion circuit 960.

In the structure of FIG. 9, the structure of level conversion circuit 960 may be any, as long as the conversion of the signal amplitude is effected between the input power cut signal PCUT and the output power cut enable signal PCUTe while the logical level of these signals is maintained.

According to the fifth embodiment of the present invention, a power cut enable signal is generated according to an output signal of a level conversion circuit generating a power cut enable signal and a power on detection signal detecting power on of a power supply voltage. Consequently, an internal voltage can be reliably generated while fixing power cut enable signal PCUTe at an L level even if the voltage level of the output signal of the level conversion circuit rises upon power on. Thus, a deadlock of an internal voltage generation operation can be prevented.

Sixth Embodiment

Figure 11:
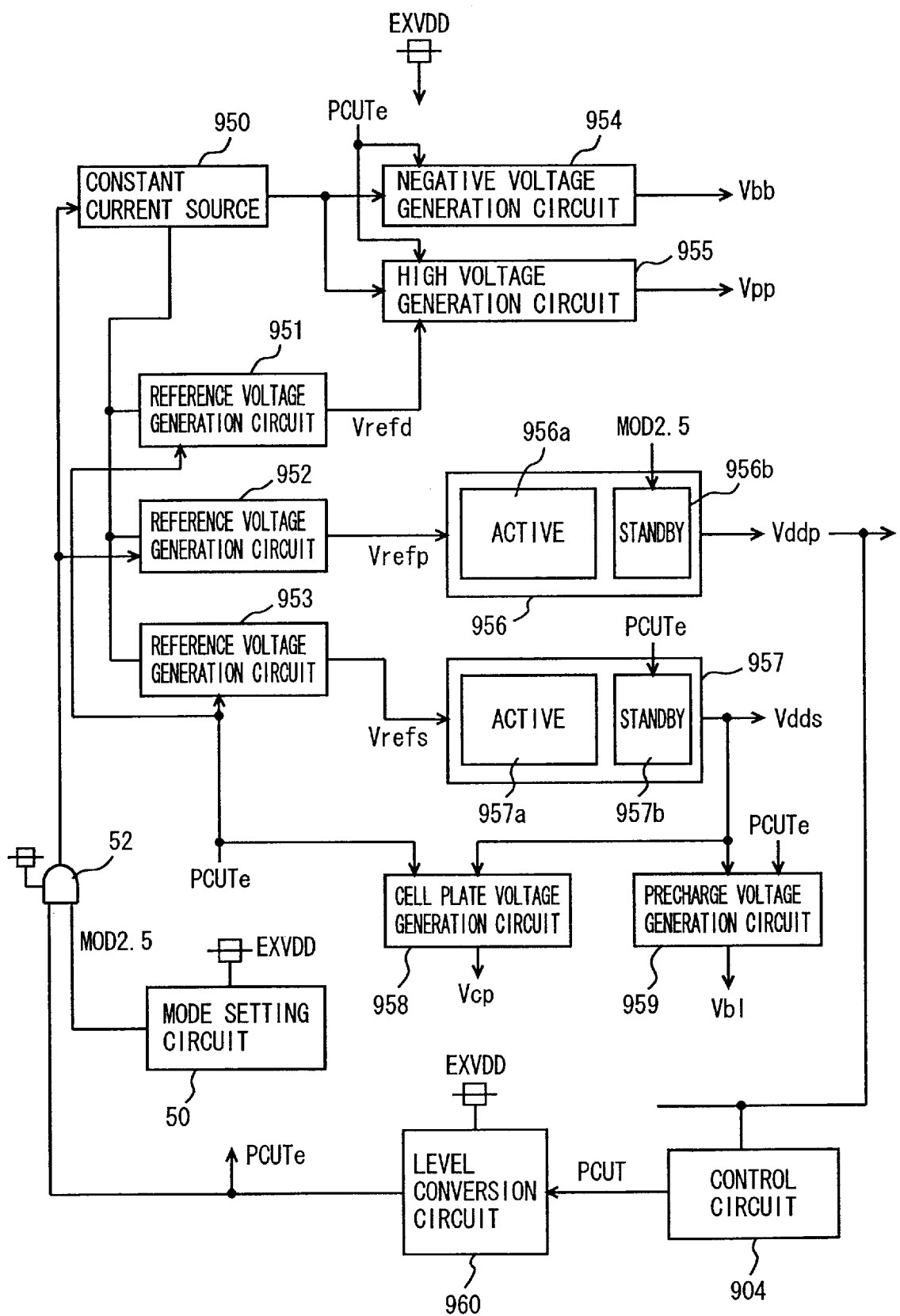
FIG. 11 schematically shows a structure of an internal voltage generation circuit according to a sixth embodiment of the present invention.

FIG. 11 schematically shows a structure of an internal voltage generation circuit according to a sixth embodiment of the present invention. The internal voltage generation circuit of FIG. 11 includes a mode setting circuit 50 for determining whether external power supply voltage EXVDD is 2.5V or 3.3V, and an AND circuit 52 receiving a mode setting signal MOD2.5 output from mode setting circuit 50 and a power cut enable signal PCUTe from level conversion circuit 960. The output signal of AND circuit 52 is applied to constant current source 950, reference voltage generation circuit 952, and standby power circuit 956b included in periphery power supply circuit 956. The remaining structure of the internal voltage generation circuit of FIG. 11 is similar to that of the internal voltage generation circuit shown in FIG. 5. Thus, corresponding components have the same reference characters allotted, and detailed description thereof will not be repeated.

In the case where a 1.8V-system interface is employed for the interface of the semiconductor memory device, either 2.5V or 3.3V is employed as external power supply voltage EXVDD. In the case where external power supply voltage is 3.3V, periphery power supply circuit 956 performs a voltage down converting operation to generate periphery power supply voltage Vddp of a predetermined voltage level. In the case where external power supply voltage EXVDD is 2.5V, external power supply voltage EXVDD is used as periphery power supply voltage Vddp. In the case where external power supply voltage EXVDD is used as periphery power supply voltage Vddp, periphery power supply voltage Vddp is generated independently of power cut enable signal PCUTe when external power supply voltage EXVDD is powered on.

When external power supply voltage EXVDD is used as periphery power supply voltage Vddp, mode setting signal MOD2.5 is set at an H level by mode setting circuit 50. Constant current source 950 has its constant current generation operation prohibited in a deep power down mode according to power cut enable signal PCUTe by AND circuit 52. Similarly, reference voltage generation circuit 952 generating reference voltage Vrefp for periphery power supply voltage has its reference voltage generation operation prohibited in a deep power down mode according to the output signal of AND circuit 52 receiving power cut enable signal PCUTe.

In the case where external power supply voltage EXVDD is 3.3V, mode setting signal MOD2.5 is set at an L level by mode setting circuit 50. In this state, the output signal of AND circuit 52 is set at an L level, and therefore, constant current source 950 and reference voltage generation circuit 952 operate even in a deep power down mode. Control circuit 904 generating power cut signal PCUT according to an externally applied command CMD can be operated even in a deep power down mode.

In periphery power supply circuit 956, mode setting signal MOD2.5 is applied to standby power supply circuit 956b. When mode setting signal MOD2.5 is at an H level and the external power supply voltage EXVDD is employed as periphery power supply voltage Vddp, the external power supply node is directly connected to the periphery power supply line in standby power supply circuit 956b. For active power supply circuit 956a, reference voltage Vrefp is set at a voltage level corresponding to the voltage level of external power supply voltage EXVDD. In an active cycle, current is supplied from the external power supply node to the periphery power supply line with a great current drivability by active power supply circuit 956a.

In the case where mode setting signal MOD2.5 is applied to reference voltage generation circuit 952 and external power supply voltage EXVDD is employed as the periphery power supply voltage, external power supply voltage EXVDD may be employed as reference voltage Vrefp.

In addition, a switching transistor that selectively connects the periphery power supply line with the external power supply node according to mode setting signal MOD2.5 may be provided in active power supply circuit 956a in periphery power supply circuit 956.

Figure 12:
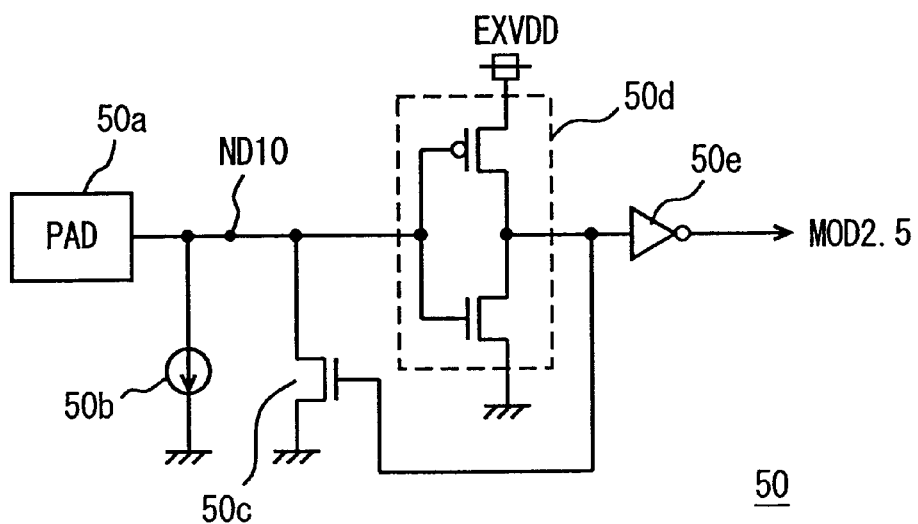
FIG. 12 shows an example of a structure of a mode set circuit of FIG. 11.

FIG. 12 shows an example of a structure of mode setting circuit 50 of FIG. 51. Referring to FIG. 12, mode setting circuit 50 includes a current driving element 50b of high resistance connected between a node ND10 coupled to a pad 50a and the ground node, an inverter 50d inverting and the logic level of the voltage of node ND10, an inverter 50e inverting an output signal of inverter 50d to generate mode setting signal MOD2.5, and an N channel MOS transistor 50 rendered conductive when the output signal of inverter 50d is at H level, to hold the node ND10 at the level of the ground voltage.

In the case where external power supply voltage EXVDD is 2.5V, and this external power supply voltage EXVDD is employed as periphery power supply voltage Vddp, pad 50a is connected to the power supply terminal that receives the external power supply voltage via a bonding wire. Since current driving element 50b is an element of high resistance and functions as a pull down element, node ND10 is set at the level of external power supply voltage EXVDD after power on. Therefore, inverter 50d provides an output signal of an L level. In response, mode setting signal MOD2.5 from inverter 50e is set at the level of external power supply voltage EXVDD. In such a state, MOS transistor 50c receives a signal of an L level from inverter 50d at its gate, and is in an off state.

In the case where external power supply voltage EXVDD is 3.3V, and this external power supply voltage EXVDD is down-converted for generation of periphery power supply voltage Vddp, bonding is not effected to pad 50a. In this case, any rise of the voltage level of node ND10 is prevented by current driving element 50b. Inverter 50d outputs a signal of an H level according to the voltage level of node ND10, and MOS transistor 50c is driven to a conductive state. Therefore, node ND10 is maintained at the level of the ground voltage by inverter 50d and MOS transistor 50c. Inverter 50e inverts the output signal of inverter 50d to generate mode setting signal MOD2.5 of an H level.

More specifically, when external power supply voltage EXVDD of 3.3V is down-converted for generation of periphery power supply voltage Vddp, mode setting signal MOD2.5 is set at an L level. When external power supply voltage EXVDD of 2.5V is directly employed as periphery power supply voltage Vddp, mode setting signal MOD2.5 is set at an H level.

In the configuration of FIG. 12, mode setting signal MOD2.5 is generated through a selective formation of the bonding wire to pad 50a. Alternatively, mode setting signal MOD2.5 may be set to the level of external power supply voltage EXVDD or the ground voltage through metal mask interconnection.

Moreover, as an alternative to current driving element 50b, a link element that is fusible with an energy beam such as laser beam may be employed. When such a link element is used, the link element is provided between the power supply node and node ND10. The N channel MOS transistor receiving a reset signal at its gate is arranged in parallel to MOS transistor 50c. The reset signal is rendered active upon power on or system resetting. If the link element is blown, node ND10 is held at an L level, and mode setting signal MOD2.5 is set at an L level. When the link element is non-blown, node ND10 is held at an H level by the link element, and mode setting signal MOD2.5 is set at an H level.

Figure 13:
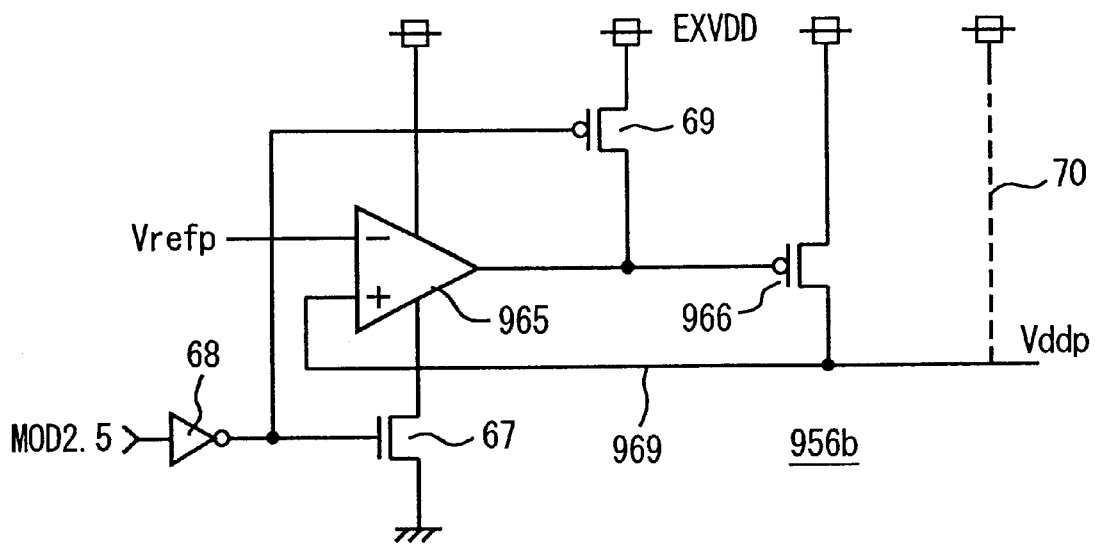
FIG. 13 shows an example of a structure of a standby power supply circuit in the periphery power supply circuit of FIG. 11.

FIG. 13 shows an example of a structure of standby power supply circuit 956b of FIG. 11. Referring to FIG. 13, standby power supply circuit 956b includes an N channel MOS transistor 67 connected between the internal power supply node of comparison circuit 965 and the ground node, and receiving mode set signal MOD2.5 at its gate via n inverter 68, a P channel MOS transistor 69 connected between the external power supply node and the output node of comparison circuit 965 and receiving the output signal of inverter 68 at its gate, and a P channel MOS transistor 966 connected between the external power supply node and periphery power supply line 969 and receiving the output signal of comparison circuit 965 at its gate. Inverter 68 receives external power supply voltage EXVDD as an operating power supply voltage.

In the case where mode setting signal MOD2.5 is at H level indicating that external power supply voltage EXVDD is 2.5V, MOS transistor 67 and MOS transistor 69 are turned off and on, respectively. The output node of comparison circuit 965, i.e., the gate of current driving MOS transistor 966 is set at the level of external power supply voltage EXVDD. Therefore, MOS transistor 966 is constantly set at a non-conductive state, and comparison circuit 965 is maintained in an inactive state because MOS transistor 67 is kept off. When external power supply voltage EXVDD is 2.5V, periphery power supply line 969 is connected to the external power supply node via a metal interconnection line 70.

In the case where mode set signal MOD2.5 is set at an L level indicating that external power supply voltage EXVDD is 3.3V, MOS transistor 67 and MOS transistor 69 are turned on and off, respectively. Therefore, metal interconnection line 70 is not formed in this power supply voltage mode. Comparison circuit 965 adjusts the gate voltage of MOS transistor 966 in accordance with periphery power supply voltage Vddp and reference voltage Vrefp.

Connection between the external power supply node and the periphery power supply line is made by metal interconnection line 70. Metal interconnection line 70 is formed, in a slice process step, through a mask interconnection depending upon the voltage level of the used external power supply voltage. A P channel MOS transistor receiving an inverted signal of mode setting signal MOD2.5 at its gate may be disposed between the external power supply node and periphery power supply line 969.

In periphery power supply circuit 956, active power supply circuit 956a supplies current from the external power supply node to peripheral power supply line 969 according to periphery power supply voltage Vddp and reference voltage Vrefp, independently of mode setting signal MOD2.5. This is done to prevent drop of the power supply voltage of periphery power supply line 969 in an active cycle caused by the interconnection line resistance when metal interconnection line 70 is formed. However, in the case where the line width of the metal interconnection line 70 is made wide enough to reduce the interconnection resistance of metal interconnection line 70 enough and sufficient current can be supplied in an active cycle, the active power supply circuit in periphery power supply circuit 956 can be set to a non-operative state when mode setting signal MOD2.5 is set at an H level indicating that external power supply voltage EXVDD is 2.5V.

In the case where active power supply circuit 956a in periphery power supply circuit 956 supplies a current to the periphery power supply line 969 according to the relationship between the voltage on the periphery power supply line and reference voltage Vrefp, independently of the level of the power supply voltage, reference voltage Vrefp has its voltage level altered according to mode setting signal MOD2.5 when the voltage level of the periphery power supply voltage is altered according to the voltage level of the external power supply voltage EXVDD.

According to the sixth embodiment of the present invention, the circuitry related to the periphery power supply voltage maintains an active state in a deep power down mode according to whether the external power supply voltage is employed as the periphery power supply voltage or not. In both of the case where external power supply voltage is employed as the periphery power supply voltage and the case where the external power supply voltage is down-converted for generation of the periphery power supply voltage, the periphery power supply voltage is generated according to the external power supply voltage upon power on of the external power supply voltage. Therefore, even if power cut enable signal PCUTe goes high due to the unstable or indefinite state of level conversion circuit 960, the power cut signal PCUT is reliably set at an L level by the control circuit that receives periphery power supply voltage Vddp, to set power cut enable signal PCUTe at an L level. Thus, a deadlock of an internal voltage generation operation can be reliably prevented to ensure generation of an internal voltage.

Seventh Embodiment

Figure 14:
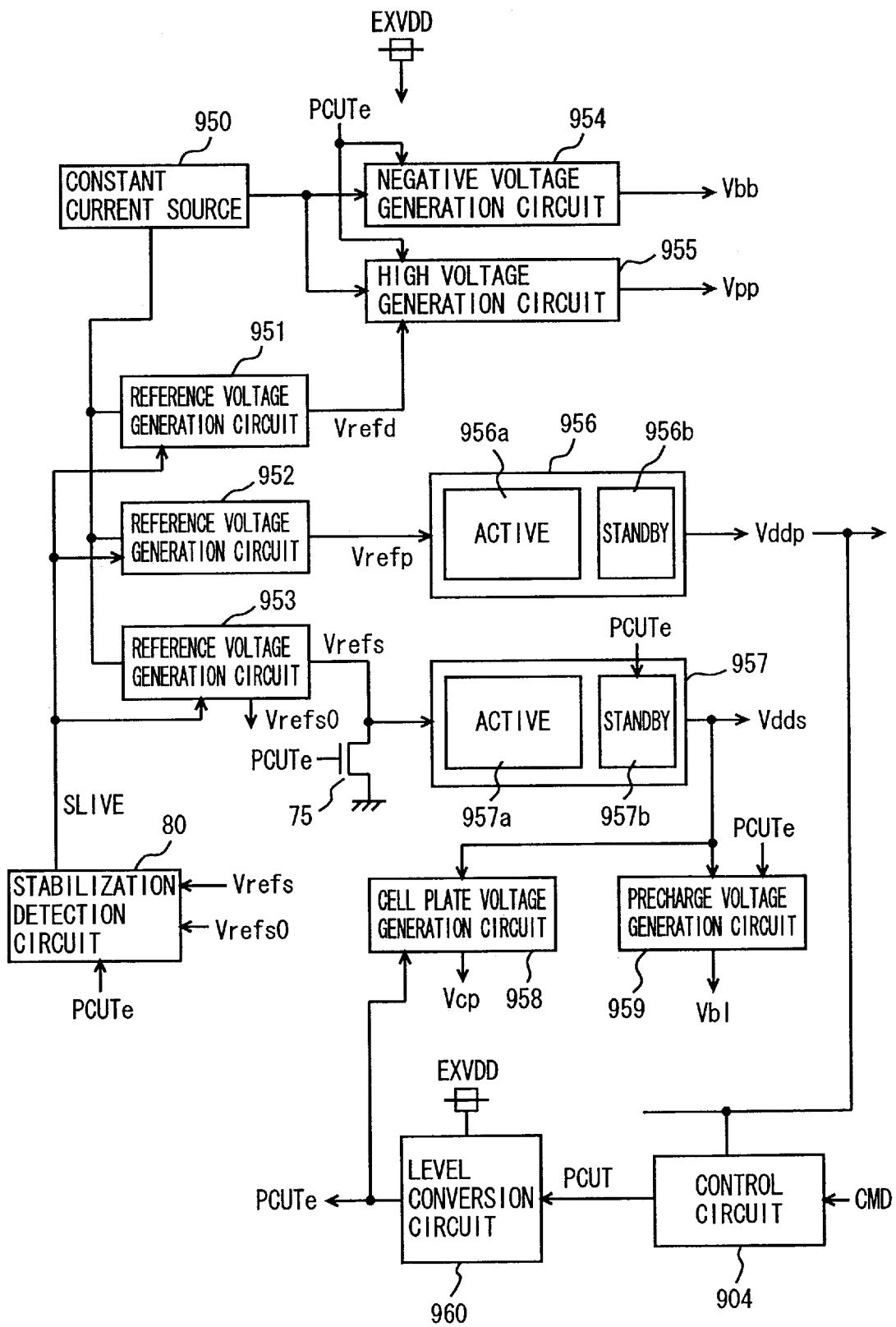
FIG. 14 schematically shows a structure of an internal voltage generation circuit according to a seventh embodiment of the present invention.

FIG. 14 schematically shows a structure of an internal voltage generation circuit according to a seventh embodiment of the present invention. Referring to FIG. 14, the internal voltage generation circuit includes an N channel MOS transistor 75 for setting reference voltage Vrefs output from reference voltage generation circuit 953 to the level of the ground voltage in response to power cut enable signal PCUTe, and a stabilization detection circuit 80 for detecting whether reference voltage Vref is stabilized or not according to basic voltage Vref0 generated by reference voltage generation circuit 953 and reference voltage Vrefs.

Stabilization detection circuit 80 has its output signal SLIVE fixed at an H level during a deep power down mode where power cut enable signal PCUTe is at an H level. When power cut enable signal PCUTe is at an L level, stabilization detection circuit 80 generates a one shot pulse signal according to the voltage relationship between reference voltage Vrefs and basic voltage Vref0.

The output signal SLIVE of stabilization detection circuit 80 is applied to reference voltage generation circuits 951–953. The current drivability of the analog buffers included in these reference voltage generation circuits 951–953 is made large during the activation period of signal SLIVE, whereby reference voltages Vrefs, Vrefp and Vrefd are pulled up at high speed.

Constant current source 950 operates to supply constant current even in a deep power down mode. This is required since periphery power supply voltage Vddp is consumed by control circuit 904, and power cut signal PCUT must be rendered inactive according to an externally applied command CMD.

When external power supply voltage EXVDD is powered on, the current drivability of the analog buffer for generating a reference voltage is increased according to output signal SLIVE of stabilization detection circuit 80, whereby reference voltages Vrefd, Vrefp and Vrefs can be pulled up at high speed.

Even if periphery power supply voltage Vddp is generated at the time of exit from the deep power down mode, the voltage level of the remaining reference voltages Vrefd and Vrefs can be pulled up at high speed according to output signal SLIVE of stabilization detection circuit 80. In such a case, periphery power supply voltage Vddp is generated in the power down mode, and the operating current of the analog buffer in reference voltage generation circuit 952 increases when the deep power down mode is released. However, the same control circuit can be used to increase the operating current of the analog buffer in reference voltage generation circuit 952 generating reference voltage Vrefp for the periphery power supply voltage upon power on of external power supply voltage or upon exit from the deep power down mode. Therefore, the scale of the control circuitry is reduced.

The remaining structure of the internal voltage generation circuit shown in FIG. 14 is similar to that of the previous embodiment shown in FIG. 11. Therefore, corresponding components have the same reference characters allotted, and description thereof will not be repeated.

Figure 15:
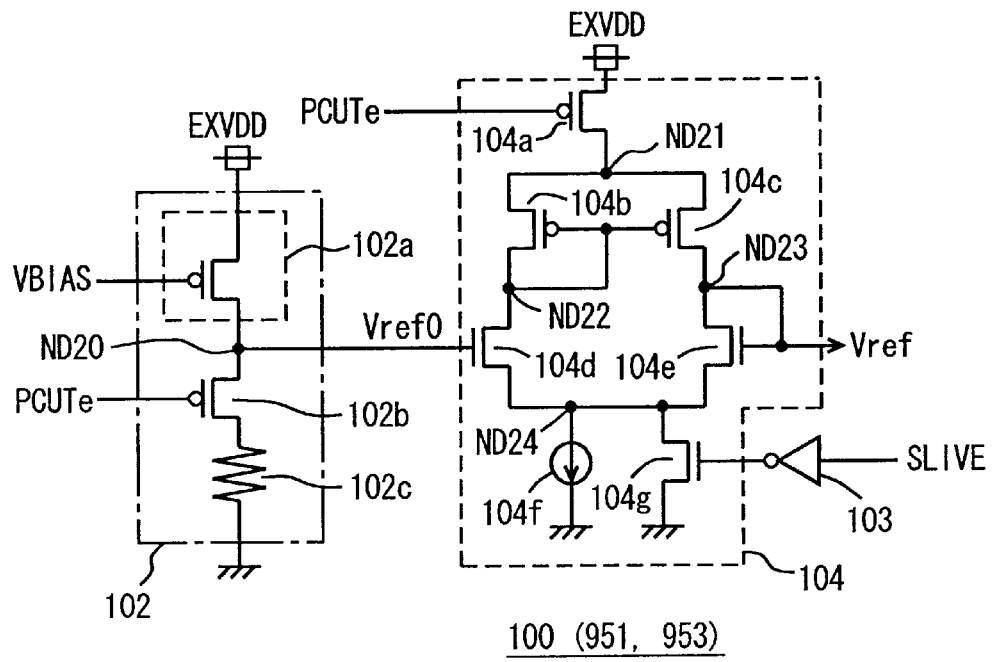
FIG. 15 shows an example of a structure of a reference voltage generation circuit of FIG. 14.

FIG. 15 shows a structure of reference voltage generation circuits 951 and 953 of FIG. 14. Since reference voltage generation circuits 951 and 953 have the same structure, reference voltage generation circuit 100 is shown as a representative of reference voltage generation circuits 951 and 953 in FIG. 15.

Referring to FIG. 15, reference voltage generation circuit 100 includes a basic voltage generation circuit 102 generating a basic voltage Vref0 according to a constant current (bias voltage VBIAS) from constant current source 950, and an analog buffer 104 buffering the output signal of basic voltage generation circuit 102 to generate a reference voltage Vref Basic voltage generation circuit 102 includes a constant current source 102a connected between the external power supply node and node ND20, and a MOS transistor 102b and a resistance element 102c connected in series between node ND20 and the ground node. When MOS transistor 102b is non-conductive, resistance element 102c is disconnected from node ND20.

Constant current source 102a includes a P channel MOS transistor supplying a constant current of a constant level according to the constant current from the constant current source. In FIG. 15, this constant current source transistor is shown having the driving current adjusted according to bias voltage VBIAS from constant current source 950. The structure of constant current source 102a is any, as long as a current corresponding to the constant current from constant current source 950 is supplied.

MOS transistor 102b receives a power cut enable signal PCUTe at its gate. Basic voltage Vref0 has a voltage level determined depending upon the constant current supplied from constant current circuit 102a and the resistance of resistance element 102c. In order to reduce the consumed current, the driving current of constant current circuit 102a is made low and the resistance of resistance element 102c is set high enough. Therefore, node ND20 is at a high resistance state, and the current drivability of basic voltage generation circuit 102 is low.

Analog buffer 104 includes a P channel MOS transistor 104a connected between the external power supply node and a node ND21 and receiving power cut enable signal PCUTe at its gate, a P channel MOS transistor 104b connected between nodes ND21 and ND22 and having its gate connected to node ND22, a P channel MOS transistor 104c connected between nodes ND21 and ND23 and having its gate connected to node ND22, an N channel MOS transistor 104d connected between nodes ND22 and ND24 and receiving basic voltage Vref0 at its gate, an N channel MOS transistor 104e connected between nodes ND23 and ND24, and having its gate connected to node ND23, a constant current source 104f connected between node ND24 and the ground node, and an N channel MOS transistor 104g connected between node BD24 and the ground node and receiving signal SLIVE at its gate via inverter 103. Reference voltage Vref is generated from the gate and drain node (node ND23) of MOS transistor 104g.

Analog buffer 104 shown in FIG. 15 has its current path cut off when power cut enable signal PCUTe is at an H level, whereby the output reference voltage Vref is at the level of the ground voltage. When power cut enable signal PCUTe is at an L level, MOS transistor 104a is conductive, so that a reference voltage Vref corresponding to basic voltage Vref0 is generated.

The signal SLIVE is at an L level when active. By inverter 103, MOS transistor 104g is kept on when the signal SLIVE is active. Accordingly, the driving current of analog buffer 104 is increased, so that reference voltage Vref is pulled up to a predetermined voltage level at high speed.

When power cut enable signal PCUTe is at an H level, MOS transistor 102b in basic voltage generation circuit 102 is off. Node ND20 is driven to the level of external power supply voltage EXVDD. This is because the current discharge path from constant current source 102a is cut off when constant current source 950 is constantly operating. Even if the constant current generation operation of constant current source 950 is prohibited, bias voltage VBIAS attains the level of the ground voltage in this case, whereby MOS transistor 102a is rendered conductive. Therefore, node ND20 is set to the level of external power supply voltage EXVDD as well.

Figure 16:
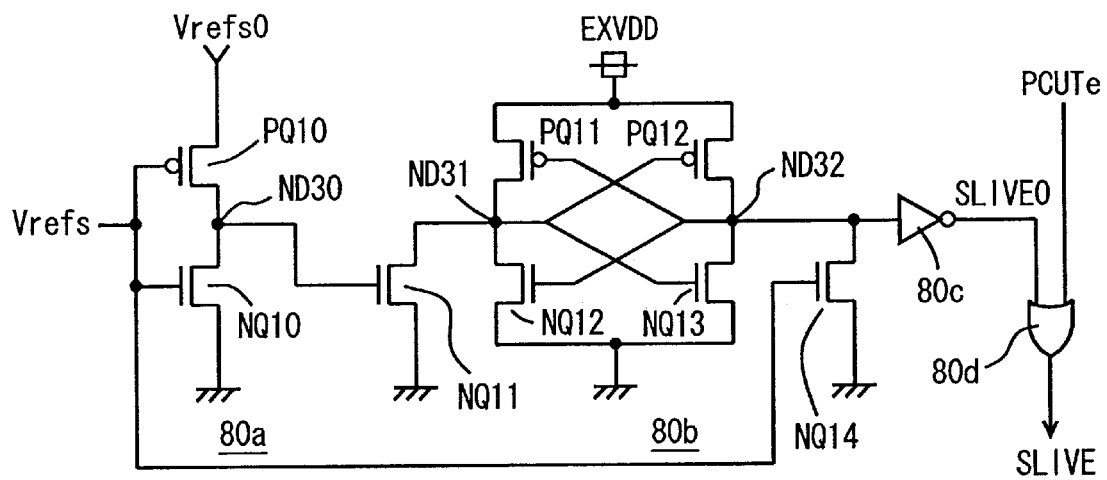
FIG. 16 shows an example of a structure of a stabilization detection circuit of FIG. 14.

FIG. 16 shows a structure of stabilization detection circuit 80 shown in FIG. 14. Referring to FIG. 16, stabilization detection circuit 80 includes an inverter 80a receiving basic voltage Vref0 as the operating power supply voltage, and reference voltage Vrefs as the input signal, a latch circuit 80b having the voltage level of a latching signal thereof set according to the input/output signal of inverter 80a, an inverter 80c inverting the signal at a latch node ND31 of latch circuit 80b to generate a signal SLIVE0, and a gate circuit 80d receiving the output signal SLIVEO from inverter 80c and power cut enable signal PCUTe to generate a detection signal SLIVE.

Inverter circuit 80a includes a P channel MOS transistor PQ10 transmitting basic voltage Vrefs0 to node ND30 according to reference voltage Vrefs, and an N channel MOS transistor NQ10 discharging node ND30 to the level of the ground voltage according to reference voltage Vrefs. Inverter 80a discharges node ND30 to the level of the ground voltage when the voltage level of reference voltage Vrefs rises according to basic voltage Vrefs0.

In a deep power down mode, reference voltage Vrefs is maintained at the level of the ground voltage by MOS transistor 75 shown in FIG. 14. Basic voltage Vrefs0 is set at the level of external power supply voltage EXVDD by MOS transistor 102b in reference voltage generation circuit 102 shown in FIG. 15. Therefore, node ND30 is maintained at the level of external power supply voltage EXVDD in the deep power down mode. When the deep power down mode is released, the voltage level of reference voltage Vrefs rises, and the voltage level of basic voltage Vrefs0 falls to a predetermined voltage level. Node ND30 is discharged by MOS transistor NQ10. Therefore, the voltage level of node N30 changes when reference voltage Vrefs arrives at a predetermined voltage level by inverter 80a upon exit from the deep power down mode.

Similarly, upon power up of the external power supply voltage, basic voltage Vrefs0 is first stabilized, and then reference voltage Vrefs is stabilized by analog buffer 104. Therefore, the voltage level of node ND30 attains an H level according to basic voltage Vrefs0 immediately after power on, and then attains an L level when reference voltage Vrefs is stabilized.

Latch circuit 80b includes an N channel MOS transistor NQ11 connected between node ND31 and the ground node and having its gate connected to node ND30, an N channel MOS transistor NQ14 connected between node ND32 and the ground node and receiving reference voltage Vrefs at its gate, a P channel MOS transistor PQ11 connected between the external power supply node and node ND31 and having its gate connected to node ND30, a P channel MOS transistor PQ12 connected between the external power supply node and node ND32 and having its gate connected to node ND31, an N channel MOS transistor NQ12 connected between node ND31 and the ground node and having its gate connected to node ND32, and an N channel MOS transistor NQ13 connected between node ND32 and the ground node and having its gate connected to node ND31.

MOS transistors PQ11 and PQ12 pull up the node of the higher potential out of nodes ND31 and ND32 to the level of external power supply voltage EXVDD. MOS transistors NQ12 and NQ13 pull down the node of the lower potential out of nodes ND31 and ND32 to the level of the ground voltage. Nodes ND31 and ND32 have their voltage level set by MOS transistors NQ11 and NQ14 respectively receiving the output and input signals of inverter 80a.

When node ND30 is at an H level upon exit from the deep power down mode, node ND31 is at the level of the ground voltage whereas node ND32 is at the level of external power supply voltage EXVDD. When reference voltage Vrefs is stabilized according to basic voltage Vrefs0 at the time of exit from the deep power down mode or at the time of power on, the output signal of inverter 80a attains an L level. Node ND32 attains the level of the ground voltage, and node ND31 attains the level of external power supply voltage EXVDD. Therefore, by altering the latch state through latch circuit 80b according to the output signal of inverter 80a, the state of the signal SLIVE0 outputted from inverter 80c can be altered depending upon whether reference voltage Vrefs is stabilized or not.

Upon stabilization of reference voltage Vrefs, output signal SLIVE0 from inverter 80c attains an H level. Inverter 80c receives external power supply voltage EXVDD as the operating power supply voltage, and the signal SLIVE0 attains an H level of external power supply voltage EXVDD.

Gate circuit 80d fixes its output signal SLIVE to an H level when power cut enable signal PCUTe is at an H level. Therefore, MOS transistor 104g of the current source maintains an off state in analog buffer 104, as shown in FIG. 15. When power cut enable signal PCUTe attains an L level, gate circuit 80d operates as a buffer circuit. Output signal SLIVE0 from inverter 80c is at an L level until reference voltage Vrefs is stabilized, and therefore, output signal SLIVE from gate circuit 80d maintains an L level. Upon stabilization of reference voltage Vrefs, output signal SLIVE0 of inverter 80c attains an H level, and output signal SLIVE of gate circuit 80d is pulled up again to an H level.

Gate circuit 80d receives external power supply voltage EXVDD as the operating power supply voltage, and therefore, the signal SLIVE output from gate circuit 80d maintains an H level according to power cut enable signal PCUTe even in a deep power down mode.

Figure 17:
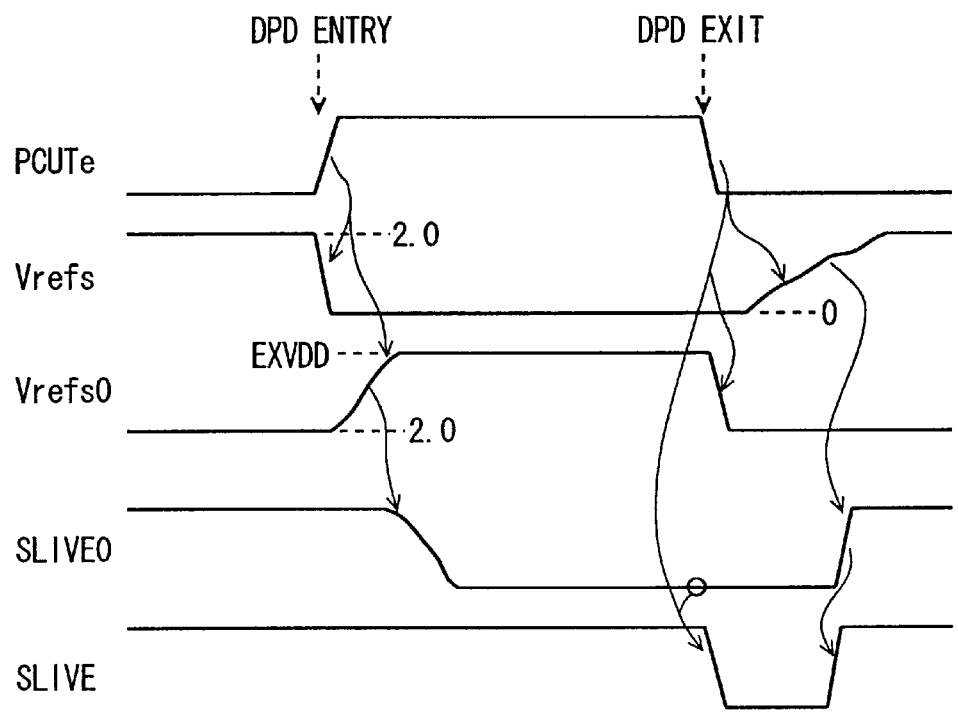
FIG. 17 is a signal waveform diagram representing an operation of the stabilization detection circuit of FIG. 16.

FIG. 17 is a signal waveform diagram representing an operation of stabilization detection circuit 80 of FIG. 16. The operation of stabilization detection circuit 80 of FIG. 16 will now be described with reference to FIG. 17.

In a normal operation mode, power cut enable signal PCUTe is at an L level. Under this state, basic voltage Vrefs0 is maintained at a predetermined voltage level, for example, at 2.0V. Reference voltage Vrefs attains a voltage level identical to that of basic voltage Vref0. Output node ND30 of inverter 80a is at the level of the ground voltage. MOS transistors NQ14 and NQ11 are in on and off states, respectively. Node ND32 is maintained at the level of the ground voltage. Therefore, output signal SLIVE0 from inverter 80c is at an H level, whereby output signal SLIVE of gate circuit 80d is at an H level.

When a deep power down mode (DPD) is set and power cut enable signal PCUTe is pulled up to an H level, the voltage level of basic voltage Vrefs0 rises to the level of external power supply voltage EXVDD, as shown in FIG. 17. Reference voltage Vrefs is fixed at the level of the ground voltage by MOS transistor 75 shown in FIG. 15. Analog buffer 104 has the current path cut off with MOS transistor 104a in an off state, and is made inactive.

When reference voltage Vrefs is pulled down to an L level, the voltage level of node ND30 of inverter 80a attains the level of external power supply voltage EXVDD, in FIG. 16. In response to this rise of the voltage level of node ND30, MOS transistor NQ11 is turned on, whereby node ND31 is discharged to the level of the ground voltage. When node ND31 is driven to the level of the ground voltage, MOS transistor PQ12 in latch circuit 80b is turned on, whereby the voltage level of node ND32 is pulled up to the level of external power supply voltage EXVDD.

By the pull up operation of node ND32, node ND31 is pulled down to the level of the ground voltage by MOS transistor NQ12. When node ND32 is driven to the level of external power supply voltage EXVDD by MOS transistors PQ11 and PQ12, output signal SLIVE0 from inverter 80c attains an L level. Power cut enable signal PCUTe is at an H level, and the output signal of gate circuit 80d maintains an H level. This state is maintained during a deep power down mode.

When a power down mode exit command is applied for exiting from the deep power down mode, power cut enable signal PCUTe attains an L level. At this stage, output signal SLIVE0 of inverter 80c is at an L level, and output signal SLIVE of gate circuit 80d is pulled down to an L level. In response to the fall of detection signal SLIVE to an L level, MOS transistor 104g is turned on in analog buffer 104 (refer to FIG. 15), whereby the operating current of analog buffer 104 is increased. Reference voltage Vref (Vrefs, Vrefd) is generated according to basic voltage Vref0 at high speed.

In reference voltage generation circuit 102, power cut enable signal PCUTe is at an L level, and MOS transistor 102b is rendered conductive, whereby basic voltage Vref0 (Vrefs0) from node ND20 arrives at the normal voltage level at high speed (since the constant current source is operating). In response to the arrival of basic voltage Vrefs0 at the predetermined voltage level, reference voltage Vref is generated according to this basic voltage Vref0. MOS transistor 75 shown in FIG. 14 is already off in such a state, and therefore, the voltage level of reference voltage Vrefs (Vref) is raised by analog buffer 104. In response to the rise of the voltage level of reference voltage Vrefs, the conductance of MOS transistor NQ10 increases whereas the conductance of MOS transistor PQ10 is reduced. When reference voltage Vrefs exceeds the threshold voltage of MOS transistor NQ10 shown in FIG. 16, MOS transistor NQ10 is rendered conductive, whereby the voltage level of node ND30 is pulled down.

In latch circuit 80b, the conductance of MOS transistor NQ14 is increased, to decrease the voltage level of node ND32. When reference voltage Vrefs attains at least a predetermined voltage level or higher, the conductance of MOS transistor NQ14 becomes larger than the conductance of MOS transistor NQ11. Responsively, node ND32 is driven to the level of the ground voltage, whereby latch circuit 80b inverts its latching state. In response, node ND32 attains the level of the ground voltage whereas node ND31 attains the level of external power supply voltage EXVDD. As a result, output signal SLIVE0 from inverter 80c attains an H level, whereby output signal SLIVE of gate circuit 80d is pulled up to an H level. In response, MOS transistor 104g is turned off in analog buffer 104, and the amount of the driving current of analog buffer 104 is reduced. Since the voltage level of reference voltage Vrefs is high enough at this stage, the output signal of analog buffer 104 can be driven to a predetermined voltage level at high speed.

Upon power up of external power supply voltage EXVDD, an operation similar to that in exiting from the deep power down mode shown in FIG. 17(DPD exit mode) is carried out in stabilization detection circuit 80, except for that basic voltage Vrefs0 rises from the ground potential level to a predetermined voltage level (for example 2.0V). Therefore, reference voltages Vrefs, Vrefd and Vrefp can be driven to a stable state at high speed even when external power supply voltage EXVDD is made on.

According to the above-described structure of stabilization detection circuit 80, stabilization of the reference voltage is detected using reference voltage Vrefs for the array power supply voltage and basic voltage Vrefs0. However, other voltages may be used as the reference voltage for the detection of stabilization. For example, reference voltage Vrefd may be used. Reference voltage Vrefp for the periphery power supply voltage is not used for this stabilization detection since the control circuit must be operated to receive a command even during a deep power down mode and the reference voltage Vrefp is maintained at a predetermined voltage level in the deep down mode and is stabilized.

According to the seventh embodiment of the present invention, determination is made whether a reference voltage is stabilized or not according to the voltage relationship between a predetermined reference voltage and a corresponding basic voltage, and the operating current of the analog buffer that generates the reference voltage is adjusted according to the determination result. Therefore, the reference voltage can be driven to a predetermined voltage level at high speed upon power up of external power supply voltage and upon exit from the deep power down mode. Thus, an internal voltage can be driven to a predetermined stable state at high speed.

Eighth Embodiment

Figure 18:
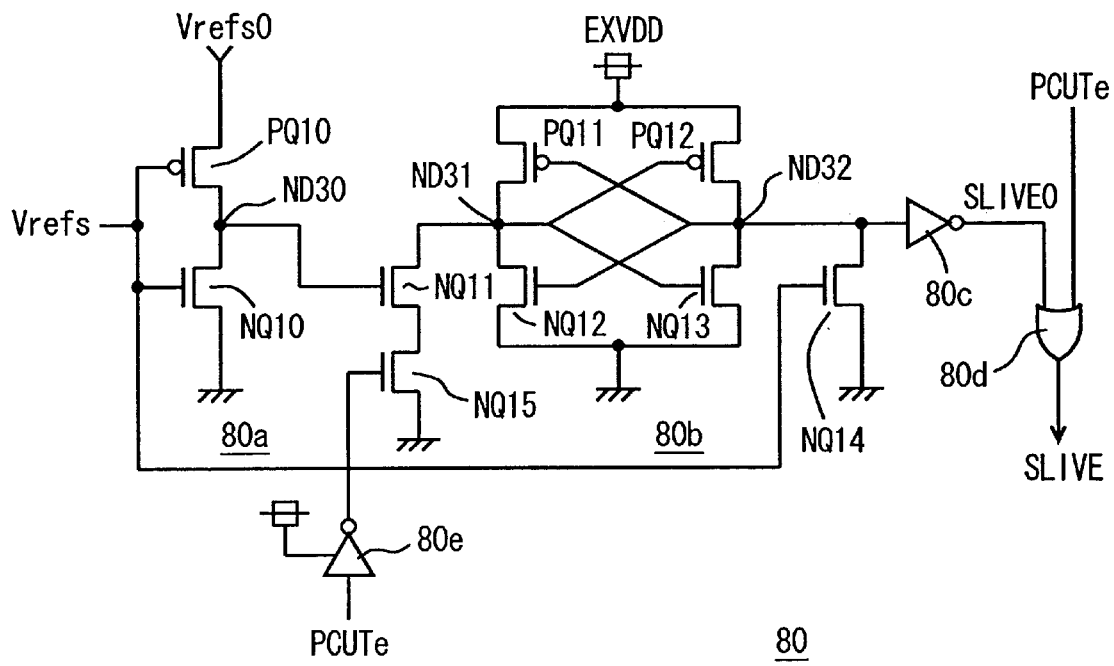
FIG. 18 shows a structure of a stabilization detection circuit according to an eighth embodiment of the present invention.

FIG. 18 shows a structure of a stabilization circuit 80 according to an eighth embodiment of the present invention. In stabilization detection circuit 80 shown in FIG. 18, an N channel MOS transistor NQ15 receiving, at a gate thereof, a power cut enable signal PCUTe through an inverter 80e is provided in series with MOS transistor NQ11 receiving the output signal of inverter 80a at its gate. The remaining structure of stabilization detection circuit 80 of FIG. 18 is similar to that of the circuit shown in FIG. 16. Corresponding components have the same reference characters allotted, and detailed description thereof will not be repeated.

In the structure of stabilization detection circuit 80 of FIG. 18, power cut enable signal PCUTe is at an L level in a normal operation mode, and inverter 80e provides an output signal of an H level to turn on MOS transistor NQ15. Basic voltage Vrefs0 and reference voltage Vrefs are both at the predetermined voltage level, and node ND30 is maintained at the level of the ground voltage. Therefore, MOS transistors NQ11 and NQ14 are in off and on states, respectively, and latch circuit 80b latches node ND32 at an L level and node ND31 at an H level.

Figure 19:
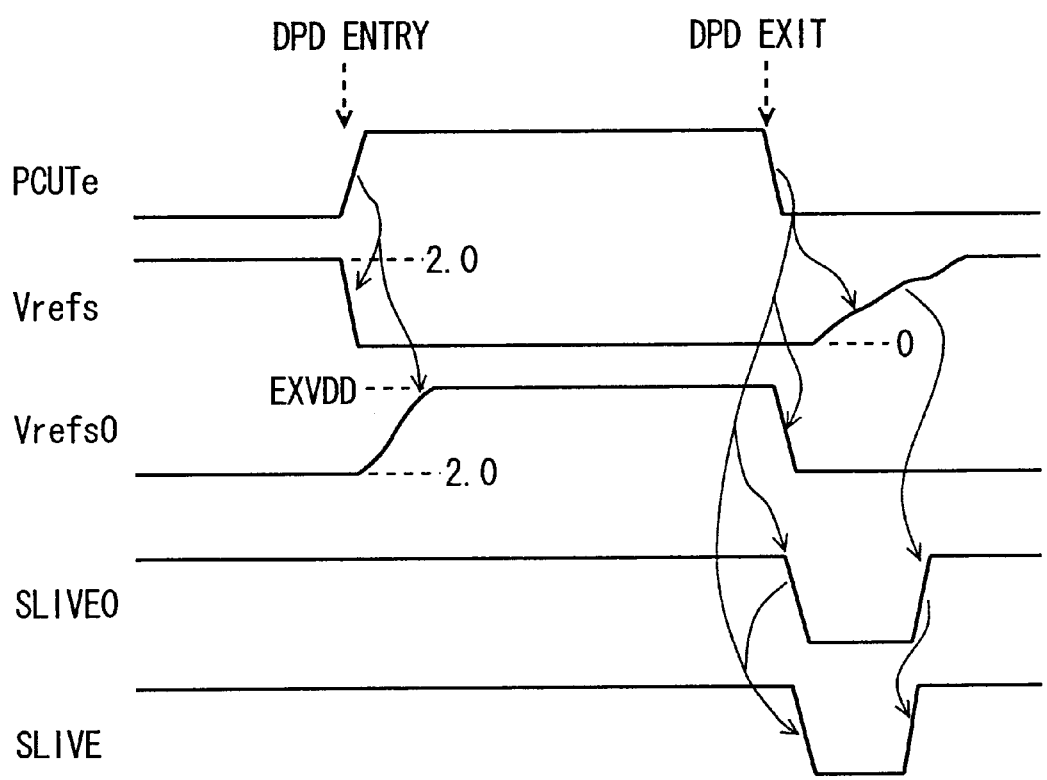
FIG. 19 is a signal waveform diagram representing an operation of the stabilization detection circuit of FIG. 18.

When a deep power down mode is set, power cut enable signal PCUTe attains an H level. In response, the output signal of inverter 80e is pulled down to an L level. In this deep power down mode, reference voltage Vrefs attains an L level of the ground voltage and node ND30 attains the level of basic voltage Vrefs0. MOS transistor NQ15 is kept off even if MOS transistor NQ11 is turned on in such a state. Latch circuit 30b maintains a state immediately before the rise of power cut enable signal PCUTe to an H level, as shown in the signal waveform diagram of FIG. 19.

In a deep power down mode, MOS transistors NQ14 and NQ15 are both turned off. MOS transistors PQ11 and PQ12, and NQ12 and NQ13 are in a latching state, and therefore, no through current flows. Thus, the through current in latch circuit 80b can be reduced in a deep power down mode to implement further reduction of the consumed current in a deep power down mode.

When the deep power down mode is released, power cut enable signal PCUTe attains an L level, whereby MOS transistor NQ15 is turned on. In this state, reference voltage Vrefs is at the level of the ground voltage and basic voltage Vrefs0 is at a predetermined voltage level (for example 2.0V). Therefore, latch circuit 80V has its latching state inverted, and the voltage level of node ND32 attains the level of external power supply voltage EXVDD. In response, output signal SLIVE0 of inverter 80c is pulled down to an L level, and detection signal SLIVE from gate circuit 80d attains an L level.

By providing, in the latch circuit, a MOS transistor that is turned off in response to a power cut enable signal in series with the MOS transistor that enters into an on state in a deep down mode, as shown in FIG. 18, the through current in the latch circuit during a deep power down mode can be reduced to reduce the consumed current.

Ninth Embodiment

Figure 20:
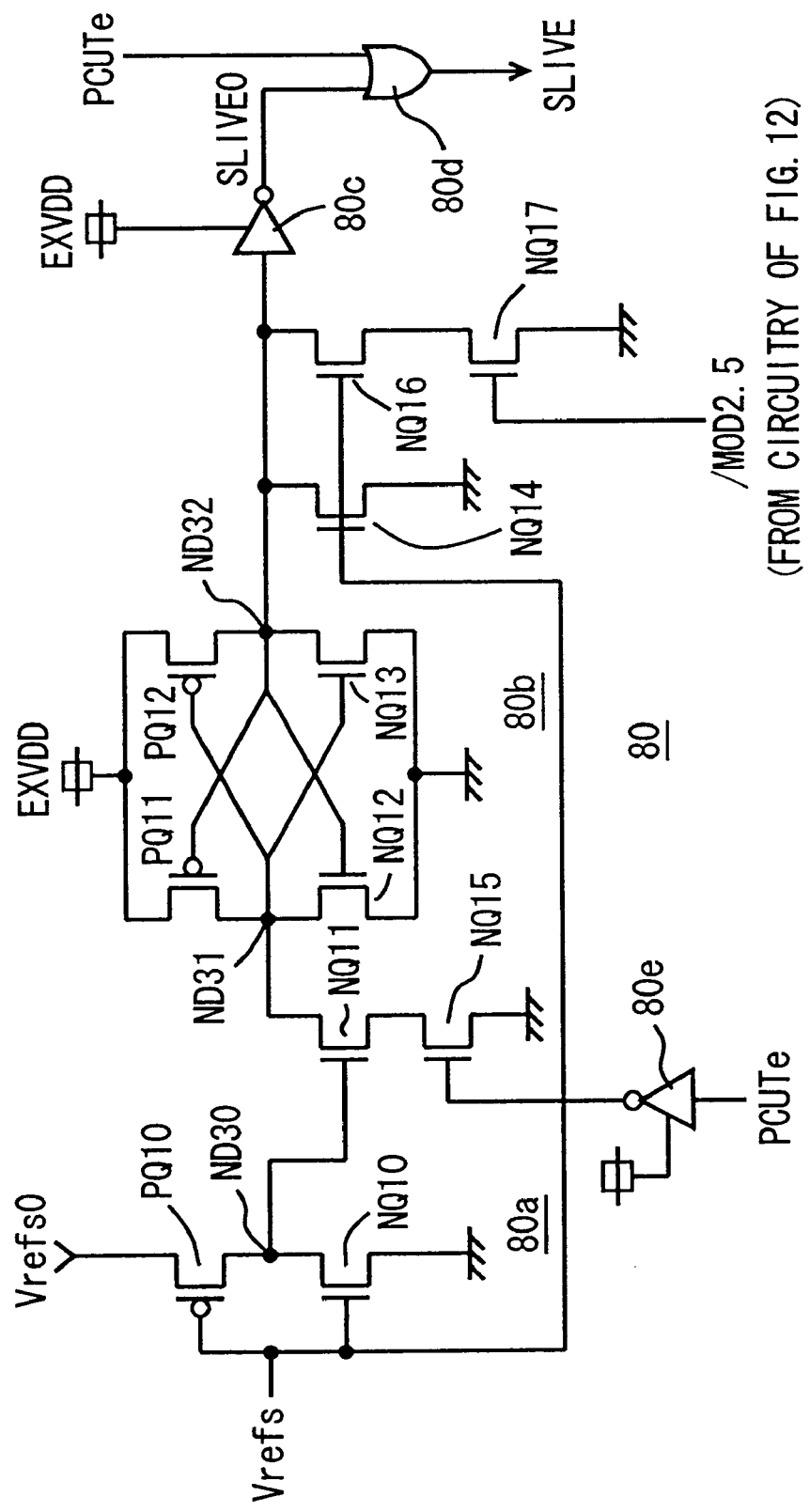
FIG. 20 shows a structure of a stabilization detection circuit according to a ninth embodiment of the present invention.
Figure 21:
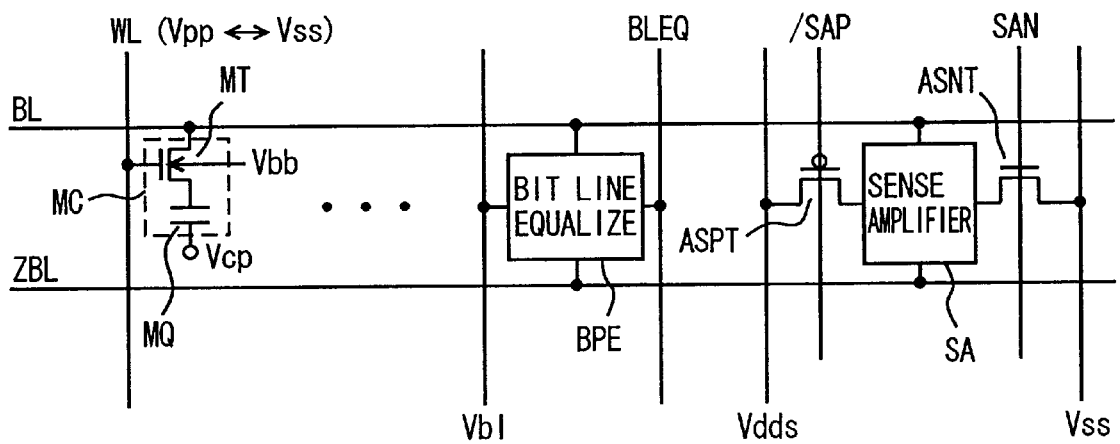
FIG. 21 schematically shows a structure of an array section of a conventional semiconductor memory device.
Figure 22:
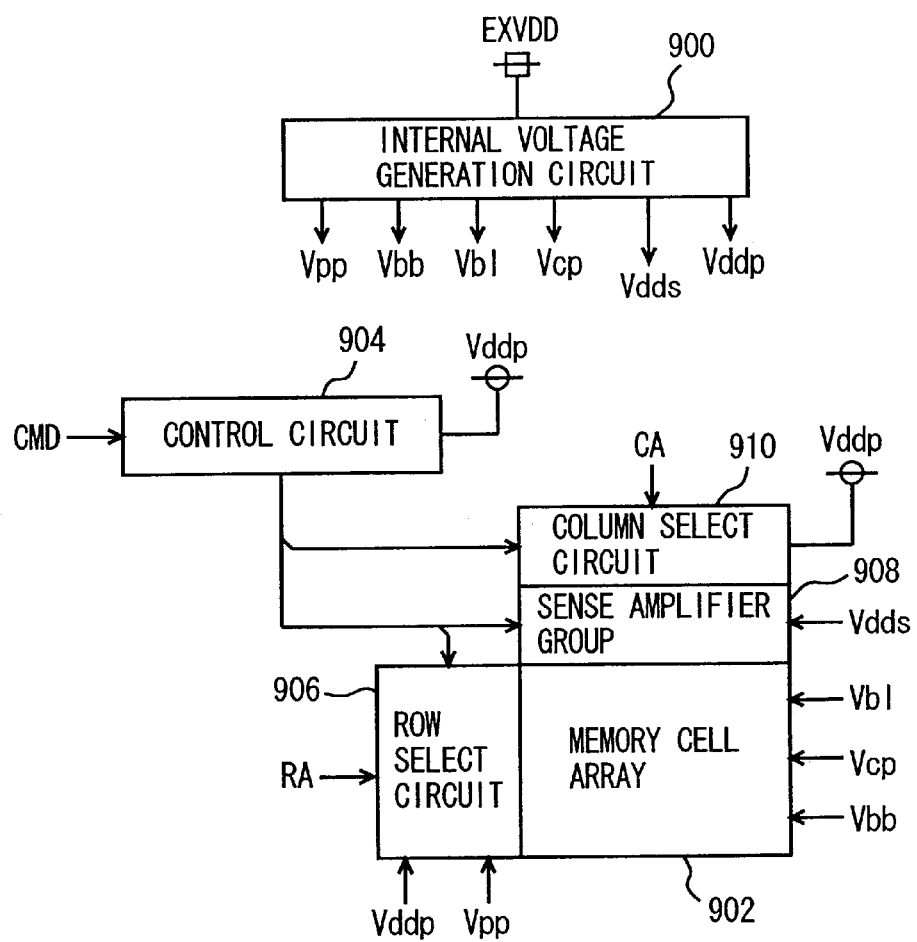
FIG. 22 schematically shows a structure of an entire structure of a conventional semiconductor memory device.
Figure 23:
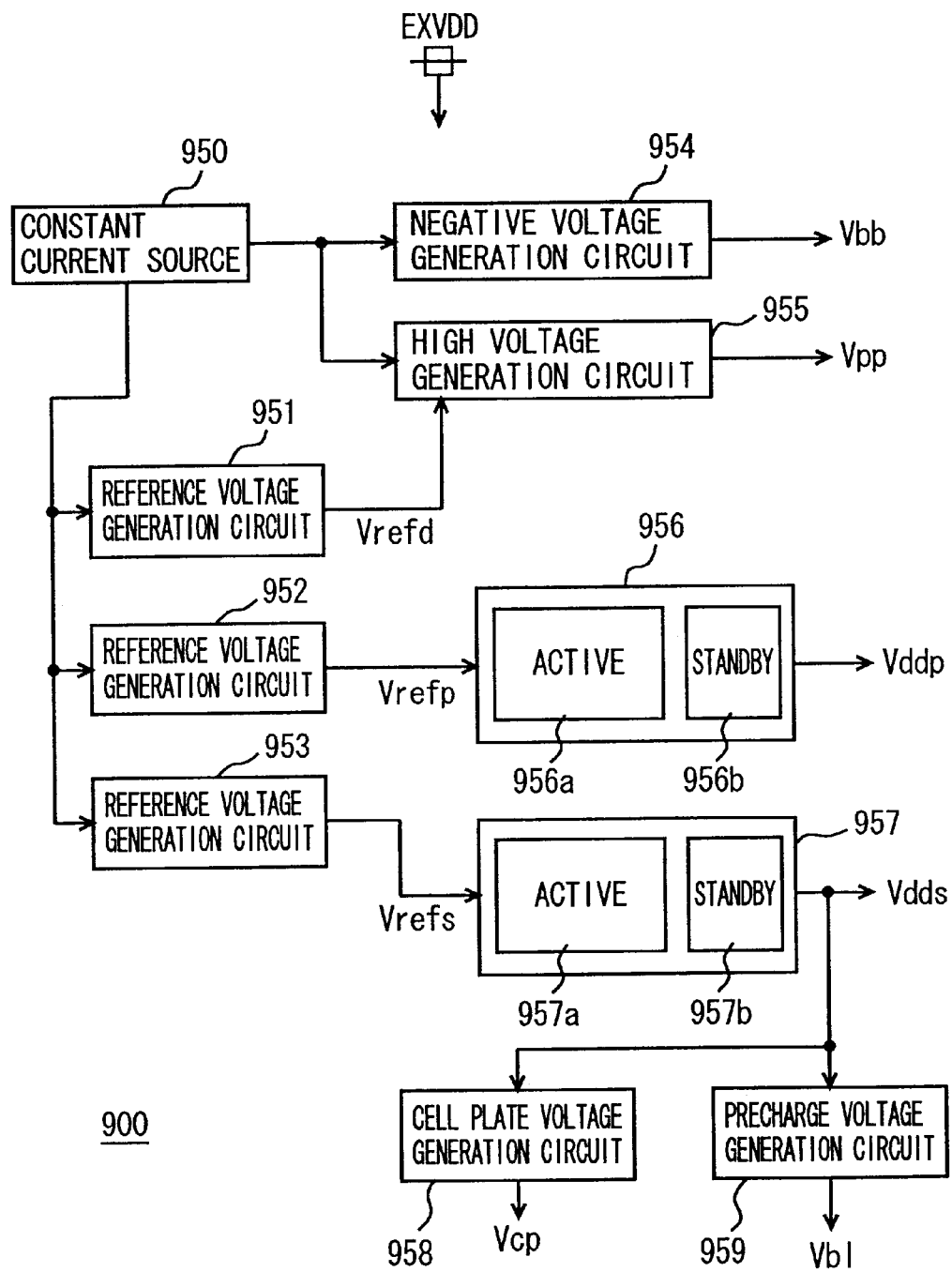
FIG. 23 schematically shows a structure of the internal voltage generation circuit of FIG. 22.
Figure 24:
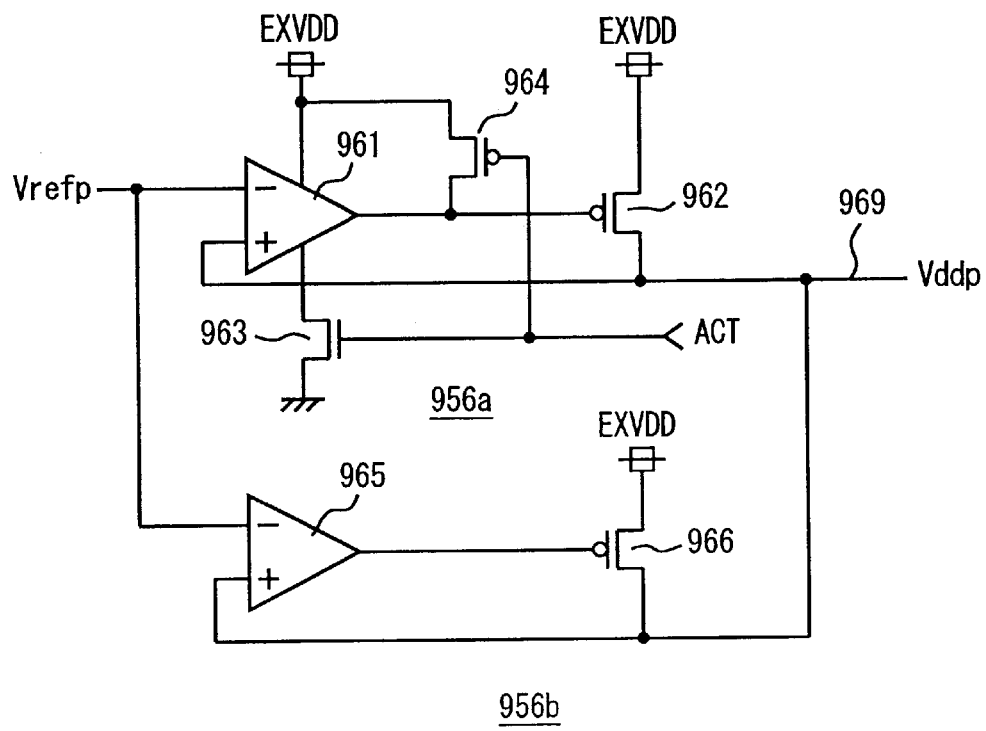
FIG. 24 shows an example of a structure of the periphery power supply circuit shown in FIG. 23.

FIG. 20 shows a structure of a stabilization detection circuit 80 according to a ninth embodiment of the present invention. Referring to FIG. 20, N channel MOS transistors NQ16 and NQ17 are provided between node ND32 and the ground node. These MOS transistors NQ16 and NQ17 form, when made conductive, a discharging path parallel to MOS transistor NQ14. The remaining structure of stabilization detection circuit 80 shown in FIG. 20 is similar to that of the stabilization detection circuit shown in FIG. 18. Corresponding components have the same reference characters allotted, and detailed description thereof will not be repeated.

MOS transistor NQ16 receives reference voltage Vrefs at its gate. MOS transistor NQ17 receives, at its gate, a mode setting signal /MOD2.5 that specifies the voltage level of external power supply voltage EXVDD. Mode setting signal /MOD2.5 is a signal complementary to mode setting signal MOD2.5 generated from the circuit shown in FIG. 12. When external power supply voltage EXVDD is set at 2.5V, mode setting signal /MOD2.5 is set at an L level. When external power supply voltage EXVDD is set at 3.3V, mode setting signal /MOD2.5 is set at an H level.

In response to the rise of reference voltage Vref from a ground voltage level, node ND32 is discharged from the H level set in a deep power down mode to the ground voltage level. When the voltage level of node ND32 becomes lower than the input logic threshold voltage of inverter 80c, output signal SLIVE0 of inverter 80c attains an H level. Therefore, the rising timing (time) of output signal SLIVE0 from inverter 80c to an H level depends upon external power supply voltage EXVDD. Therefore, when external power supply voltage EXVDD is 2.5V, mode setting signal /MOD2.5 is set to an L level, to set MOS transistor NQ17 into an off state. Node ND32 is discharged only through MOS transistor NQ14.

When external power supply voltage EXVDD is 3.3V, mode setting signal /MOD2.5 is set to an H level to cause node ND32 to be discharged through MOS transistors NQ14 and NQ16. Accordingly, node ND32 can be discharged at high speed even if external power supply voltage EXVDD is as high a level as 3.3V. A detection signal SLIVE of substantially the same pulse width can be generated independently of the voltage level of power supply voltage EXVDD. Thus, detection signal SLIVE can be kept active for a predetermined period of time according to the voltage level of reference voltage Vrefs irrespective of the voltage level of external power supply voltage EXVDD.

According to the ninth embodiment of the present invention, the size (the ratio of the channel width to channel length) of the discharging transistor of the latch node is altered according to the voltage level of the external power supply voltage in the detection circuit that detects whether the reference voltage reaches a predetermined voltage level. A detection signal SLIVE having substantially the same activation period of time can be generated independently of the voltage level of the external power supply voltage.

In the structure of FIG. 20, the size of the driving transistors of node ND32 is set to 1:2 when external power supply voltage EXVDD is 2.5V and 3.3V. Instead of this integral ratio of 1 to 2, the ratio of the drivability may be set to 1 to 1.5, for example. In the case where MOS transistor NQ14 is formed of two unit transistors and MOS transistor NQ16 is formed of one unit transistor, a ratio of drivability of 2 to 3 can be realized.

According to the ninth embodiment of the present invention, the drivability of the latch node of the latch circuit that generates a stabilization detection signal is altered according to the voltage level of the external power supply voltage. A detection signal of a predetermined time width is generated independently of the voltage level of the external power supply voltage. The operating current of the analog buffer that generates a reference voltage can be increased for a predetermined period of time.

In the previous first to ninth embodiments, a structure to generate an internal power supply voltage stably in a semiconductor memory device has been described. The present invention is applicable to any semiconductor memory device that generates a plurality of kinds of internal voltages from the external power supply voltage, and has an operation mode that prohibits generation of a predetermined internal voltage in a specific operation mode.

According to the present invention, an internal voltage can be reliably generated at high speed when the internal voltage is pulled up in a semiconductor device that has a deep power down mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

control circuitry receiving a first power supply voltage as an operating power supply voltage and generating a first power control signal according to an operation mode instruction;

level conversion circuitry for converting said first power control signal into a second power control signal of an amplitude of a level of a second power supply voltage;

initialization circuitry for setting an output signal of said level conversion circuitry at a predetermined voltage level upon power up of said second power supply voltage; and power supply circuitry selectively rendered active according to said second power control signal, and generating said first power supply voltage from said second power supply voltage when rendered active.

2. The semiconductor device according to claim 1, wherein said level conversion circuitry includes first and second output nodes producing complementary signals, and said initialization circuitry comprises at least one of a first capacitive element connected between the first output node of said level conversion circuitry and a power supply node supplying said second power supply voltage and a second capacitive element connected between the second output node and a reference node supplying a voltage differing in polarity from said second power supply voltage.

3. The semiconductor device according to claim 1, wherein said level conversion circuitry comprises a level converting circuit receiving said second power supply voltage as an operation power supply voltage, for converting said first power control signal into a power control fast signal of the amplitude of the second power supply voltage level, and a latch circuit receiving said second power supply voltage as an operating power supply voltage, and latching and transferring a voltage of an output node of said level conversion circuit to generate said second power supply control signal.

4. The semiconductor device according to claim 1, wherein said initialization circuitry comprises a power on detection circuit for detecting power on of said second power supply voltage, and a logic circuit receiving an output signal of said power on detection circuit and an output signal of said level conversion circuitry and generating said second power control signal.

5. A semiconductor device comprising:

internal voltage generation circuitry receiving a first power supply voltage, and generating a second power supply voltage from said first power supply voltage;

internal circuitry receiving said second power supply voltage as an operating power supply voltage and generating an internal operation control signal according to an externally applied operation mode instruction;

level conversion circuitry for converting an amplitude of a predetermined internal operation control signal received from said internal circuitry into an amplitude of a level of said first power supply voltage to generate a specific operation control signal;

logic circuitry receiving said first power supply voltage as an operating power supply voltage and performing a logic operation of said specific operation control signal to generate a buffer control signal; and switch circuitry for coupling a power supply line transmitting said second power supply voltage to a power supply node supplying said first power supply voltage according to said buffer control signal output from said logic circuitry.

6. The semiconductor device according to claim 5, wherein said switch circuitry comprises a P channel insulated gate field effect transistor.

7. The semiconductor device according to claim 5, wherein said internal voltage generation circuitry comprises a reference voltage generation circuit selectively rendered active in response to said specific operation control signal, and generating a reference voltage of a predetermined voltage level from said first power supply voltage when rendered active, and an internal power supply circuit comparing said reference voltage and said second power supply voltage and causing a current to flow between a power supply node supplying said first power supply voltage and a power supply line transmitting said second power supply voltage according to a result of comparison.

* * * * *